United States Patent [19]

Kawashima

[11] Patent Number: 5,327,377
[45] Date of Patent: Jul. 5, 1994

[54] STATIC RANDOM ACCESS MEMORY THAT USES THIN FILM TRANSISTORS IN FLIP-FLOP CIRCUITS FOR IMPROVED INTEGRATION DENSITY

[75] Inventor: Shoichiro Kawashima, Kawasaki, Japan

[73] Assignee: Fujitsu Limited, Kawasaki, Japan

[21] Appl. No.: 887,039

[22] Filed: May 22, 1992

[30] Foreign Application Priority Data

May 24, 1991 [JP] Japan .................................. 3-120108

[51] Int. Cl.$^5$ .............................................. G11C 11/40
[52] U.S. Cl. .................................. 365/156; 365/190; 365/202
[58] Field of Search .................... 365/154, 156, 189.01, 365/190, 202, 200, 203, 230.03, 230.06, 161

[56] References Cited

U.S. PATENT DOCUMENTS

| | | | |
|---|---|---|---|
| 4,352,997 | 10/1982 | Raymond, Jr. et al. | 365/222 |
| 4,910,712 | 3/1990 | Camarota et al. | 365/154 |
| 5,001,539 | 3/1991 | Inoue et al. | 365/154 |
| 5,051,952 | 9/1991 | Gotou | 365/190 |

Primary Examiner—Eugene R. LaRoche
Assistant Examiner—C. Glembocki
Attorney, Agent, or Firm—Nikaido, Marmelstein, Murray & Oram

[57] ABSTRACT

A static random access memory comprises a memory cell array, a plurality of bit lines provided in correspondence to said plurality of memory cell columns, a first decoder for selecting a memory cell column, a second decoder for selecting a memory cell groups included in the selected memory cell column, and a third decoder supplied for selecting a memory cell included in the selected memory cell group. Each memory cell comprises a flip-flop circuit that is formed of thin film transistors. Each memory cell group includes a predetermined number of the memory cells, a sub-bit line extending over the memory cells included in the memory cell group, a first selection circuit connected to the sub-bit line and further to the bit line that corresponds to the selected memory cell group and a second selection circuit connected to the sub-bit line and the bit line that corresponds to the selected memory cell group. The first selection circuit is activated in response to an output signal of the second decoder for causing a voltage change in the bit line in response to a voltage level on the sub-bit line, and comprises bulk transistors having diffusion regions formed in a semiconductor substrate. The second selection circuit comprises a thin film transistor that is turned on in response to a second output signal of the second decoder for connecting the bit line and said sub-bit line electrically.

9 Claims, 20 Drawing Sheets

STATIC RANDOM ACCESS MEMORY THAT USES THIN FILM TRANSISTORS IN FLIP-FLOP CIRCUITS FOR IMPROVED INTEGRATION DENSITY

BACKGROUND OF THE INVENTION

The present invention generally relates to semiconductor devices, and more particularly to a static random access memory that uses a thin film transistor (TFT) for improved integration density.

The static random access memory (SRAM) is a random access memory that stores information by the latching operation of a flip-flop circuit. The device does not require periodical refreshing contrary to the dynamic random access memory (DRAM), and is suitable for a memory that is required to have a high speed access. For example, the SRAM is used extensively for the cache memory of computers. On the other hand, SRAMs have a problem in the integration density, as they use a flip-flop circuit that includes a number of transistors, for the memory cells.

FIG. 1 shows the circuit diagram of a typical SRAM that uses transistors 2, 3, 9 and 10 that form a flip-flop circuit 8. There, the transistors 2 and 3 are formed of an n-channel MOS transistor while the transistors 9 and 10 are formed of a p-channel MOS transistor. Further, transfer gate transistors 6 and 7 are provided in correspondence to complementary bit lines BL and /BL as usual, wherein the transistors 6 and 7 are activated by a word enable signal on a word line WL.

In the construction of FIG. 1, it should be noted that all the transistors 2, 3, 6, 7, 9 and 10 are formed of so-called bulk transistors that have a channel region as well as source and drain regions formed in a single crystal substrate of a semiconductor material such as silicon. In other words, the are disposed on a planar surface of the substrate with an isolation region formed between the transistors. Typically, the isolation region has a size of a few microns. Thus, the SRAM of FIG. 1 has suffered from a problem of low integration density as compared with the DRAMs.

In order to improve the integration density of conventional SRAMs, a construction as shown in FIG. 2 is proposed. There, p-channel MOS transistors 4 and 5 that form a flip-flop circuit 1 together with the n-channel MOS transistors 2 and 3, are replaced by polysilicon resistors 4 and 5 that are provided at a level above the transistors 2 and 3. This prior art device, however, has a problem of increased power consumption as the current flows continuously through the flip-flop circuit 8.

FIG. 3 shows a circuit diagram of another prior art SRAM that uses a flip-flop circuit 11, wherein the resistors 4 and 5 of the circuit of FIG. 2 are replaced by p-channel thin film transistors (TFT) 12 and 13. The p-channel TFT is a transistor that has a channel region comprised of a polysilicon strip. There, the polysilicon strip is doped to the p-type in correspondence to the source and drain regions except for a channel region that is formed as an undoped region located between the source and drain regions. Further, a gate electrode is provided above the channel region with an intervening insulation layer. It will be noted that such a TFT, formed on a polysilicon strip, does not need the substrate and can be provided easily into a multi-level configuration. Thereby, one can increase the integration density of the SRAM significantly.

FIG. 4 shows a circuit diagram that improves the integration density of the circuit of FIG. 3 further.

Referring to FIG. 4, it will be noted that the SRAM uses a flip-flop circuit 14 that in turn includes n-channel TFTs 15 and 16 in place of the transistors 2 and 3 of the flip-flop circuit 11 of FIG. 3. The n-channel TFT uses a polysilicon strip for the channel region similarly to the p-channel TFT except that the polysilicon strip is doped to the n-type in correspondence to the source and drain regions. Further, the transfer gate transistors 6 and 7 are also replaced by n-channel TFTs 17 and 18, respectively. By constructing the flip-flop circuit 14 as well as the transfer gate transistors 17 and 19 entirely from the TFT, one can increase the integration density further.

On the other hand, the device of FIG. 4 has a drawback, associated with the characteristic of the currently available TFT, in that it takes a relatively long time for changing the voltage level of the bit lines BL and /BL when reading or writing data. It should be noted that the bit lines BL and /BL have a relatively large parasitic capacitance. On the other hand, currently available TFTs can provide only a limited turn-on current as compared with the bulk transistors used in the conventional SRAMs. In a typical example, a TFT transistor shows the turn-on current of about 10 $\mu$A, while a typical bulk MOS transistor shows the turn-on current of 1–2 mA. Obviously, this reduced turn-on current is caused by the scattering of carriers at the grain boundary of polysilicon. Thereby, the time needed for discharging the parasitic capacitance of the bit lines becomes inevitably longer, and the operational speed of the SRAM is slowed down as a result.

SUMMARY OF THE INVENTION

Accordingly, it is a general object of the present invention to provide a novel and useful static random access memory, wherein the foregoing problems are eliminated.

Another and more specific object of the present invention is to provide a static random access memory that uses a thin film transistor for a flip-flop circuit, wherein the time needed for discharging a parasitic capacitance of a bit line is substantially reduced.

Another object of the present invention is to provide a static random access memory, comprising: a memory cell array including a plurality of memory cells arranged into a plurality of memory cell columns each including a plurality of memory cells, said memory cells in each memory cell column being divided into a plurality of memory cell groups each including a predetermined number of memory cells; a plurality of complementary bit lines provided in correspondence to said plurality of memory cell columns, each complementary bit line comprising a first bit line and a second bit line for carrying complementary electric signals; first decoding means supplied with column address data for selecting one of said plurality of memory cell columns; second decoding means supplied with row address data for selecting one of said memory cell groups included in said selected memory cell column; third decoding means supplied with said row address data and further with an output of said second decoding means indicating said selected memory cell group for selecting one of said memory cells included in said selected memory cell group, said third decoding means producing further a first output signal indicating said selected memory cell group when reading data, said third decoding means producing further a second output signal indicating said selected memory cell group when writing data; each memory cell group comprising a complementary sub-bit line, said complementary sub-bit line comprising a first sub-bit line and a second sub-bit line for carrying complementary electric signals, first and second bulk transistors connected in series with each other across said first bit line and a ground for causing electric charges on said first bit line to flow to the ground when said first and second bulk transistors are turned on, said first bulk transistor being turned on in response to said first output signal of said third decoding means, said second bulk transistor having a gate connected to said first sub-bit line so as to be turned on in response to an electric signal on said first sub-bit line, third and fourth bulk transistors connected in series with each other across said second bit line and the ground for causing electric charges on said second bit line to flow to the ground when said third and fourth bulk transistors are turned on, said third bulk transistor being turned on in response to said first output signal of said second decoding means, said fourth bulk transistor having a gate connected to said second sub-bit line so as to be turned on in response to an electric signal on said second sub-bit line, a first selection TFT provided across said first bit line and said first sub-bit line for connecting said first bit line and said first sub-bit line electrically when turned on, said first selection TFT being turned on in response to said second output signal of said third decoding means, a second selection TFT provided across said second bit line and said second sub-bit line for connecting said second bit line and said second sub-bit line electrically when turned on, said second selection TFT being turned on in response to said second output signal of said third decoding means; each memory cell comprising a first p-channel TFT and a first n-channel TFT connected in series across a first voltage source and a second voltage source to form a first CMOS inverter, and a second p-channel TFT and a second n-channel TFT connected in series across said first voltage source and said second voltage source to form a second CMOS inverter, said first p-channel TFT and said first n-channel TFT having respective gates connected commonly with each other to a node where said second p-channel TFT and said second n-channel TFT are connected with each other, said second p-channel TFT and said second n-channel TFT having respective gates connected commonly with each other to a node where said first p-channel TFT and said first n-channel TFT are connected with each other, said first and second p-channel MOS transistors and said first and second n-channel MOS transistors forming a flip-flop circuit, each memory cell further comprising a first transfer gate TFT provided across said node where said first p-channel TFT and said first n-channel TFT are connected with each other and said first sub-bit line, for connecting said node and said first sub-bit line electrically when said first transfer gate TFT is turned on, said first transfer gate TFT being turned on in response to an output signal of said third decoding means, and a second transfer gate TFT provided across said node where said second p-channel TFT and said second n-channel TFT are connected with each other and said second sub-bit line, for connecting said node and said second sub-bit line with each other electrically when said second transfer gate TFT is turned on, said second transfer gate TFT being turned on in response to an output signal of said third decoding means; each of said p-channel TFT, said n-channel TFT and said selection TFT having an elongated polysilicon strip provided above a semiconductor substrate, said elongated polysilicon strip being formed with an undoped region in correspondence to a channel region, and a pair of diffusion regions provided at both sides of said channel region with respect to an elongate direction of said polysilicon strip, said p-channel TFT having said diffusion regions doped to the p-type, said n-channel TFT having said diffusion regions doped to the n-type; each of said first through fourth bulk transistors having diffusion regions formed in a substrate.

According to the present invention, it is possible to increase the integration density of the SRAM device by providing the TFTs above the bulk transistors in the form of a plurality of layers. Thereby, one can increase the memory capacity of the device significantly. By grouping the memory cells into a plurality of memory cell groups and by providing the sub-bit lines for each memory cell group that includes only a limited number of memory cells, it is possible to reduce the parasitic capacitance of the sub-bit lines as compared with the bit line that extends throughout the memory cell array. Thereby, one can change the voltage level of the sub-bit lines quickly when writing data into the memory cell. It should be noted that such a change of the voltage level of the sub-bit lines causes a change of the state of the flip-flop circuit that forms the memory cell. Associated with this feature of reduced parasitic capacitance of the sub-bit line, the construction of the present invention enables the use of a TFT for the transistor that transfers the electric charges from the bit line to the sub-bit line. Thereby, the integration density of the device is further improved. When reading data out from the memory cell, the SRAM of the present invention causes a discharging of the bit lines in response to the state of the flip-flop circuit that forms the memory cell. There, the discharging is achieved by the bulk transistors that have a large turn-on current in response to the voltage level of the sub-bit lines, and the time needed for discharging the bit line is reduced substantially even when there is a substantial parasitic capacitance associated with the bit line. Thus, the SRAM of the present invention achieves the increased integration density and the improved operational speed simultaneously.

Other objects and further features of the present invention will become apparent from the following detailed description when read in conjunction with the attached drawings.

DETAILED DESCRIPTION OF THE PREFERRED EMBODIMENTS

Figure 1:
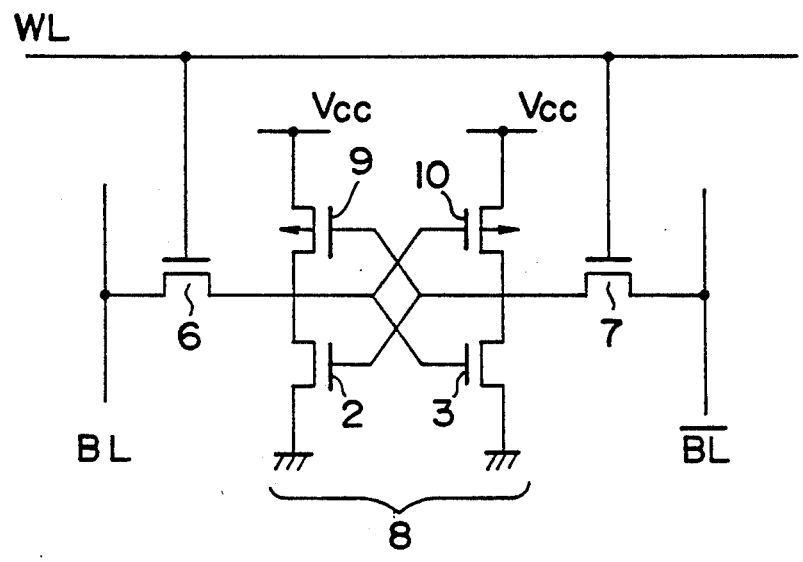
FIG. 1 is a circuit diagram showing the construction of a conventional SRAM.
Figure 2:
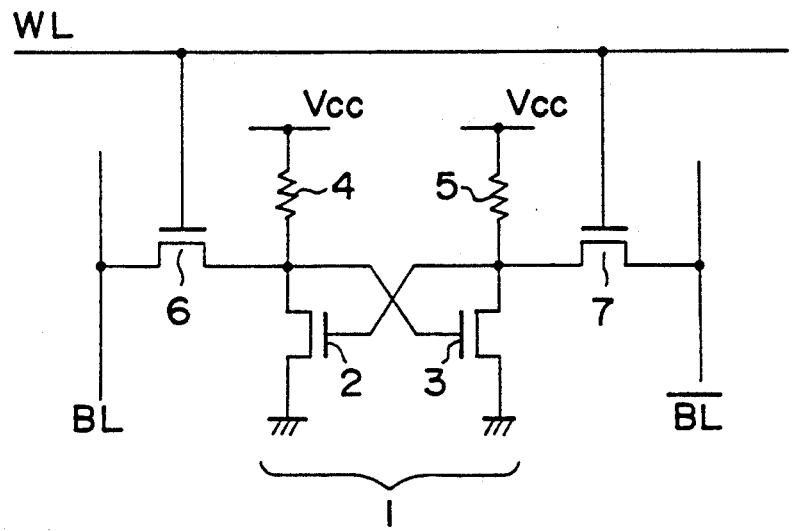
FIG. 2 is a circuit diagram showing the construction of another conventional SRAM.
Figure 3:
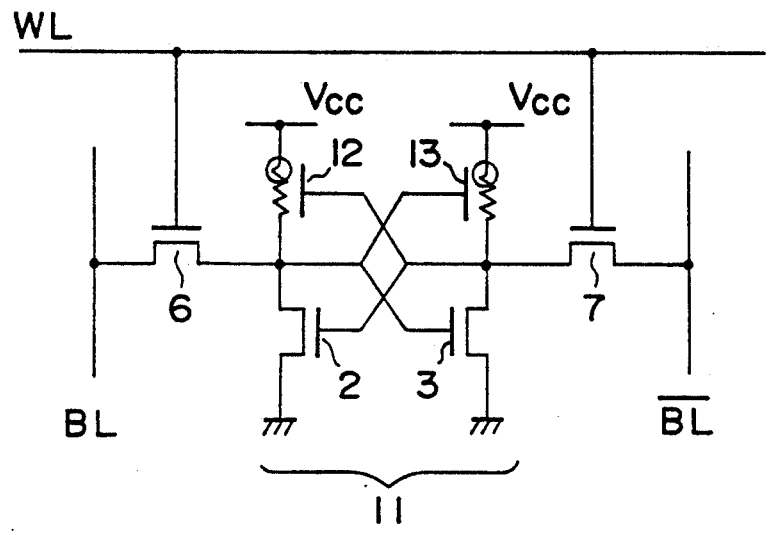
FIG. 3 is a circuit diagram showing the construction of a conventional SRAM that uses a TFT.
Figure 4:
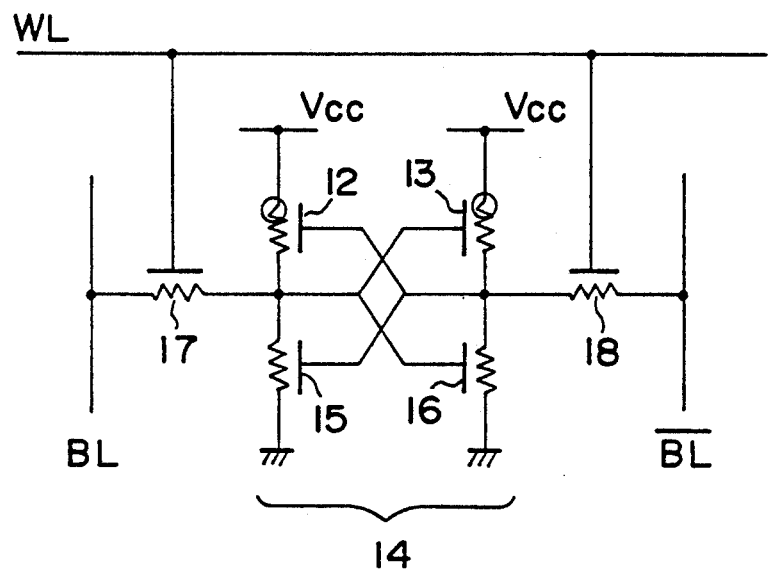
FIG. 4 is a circuit diagram showing the construction of an SRAM that has a memory cell constructed solely from TFTs.
Figure 5:
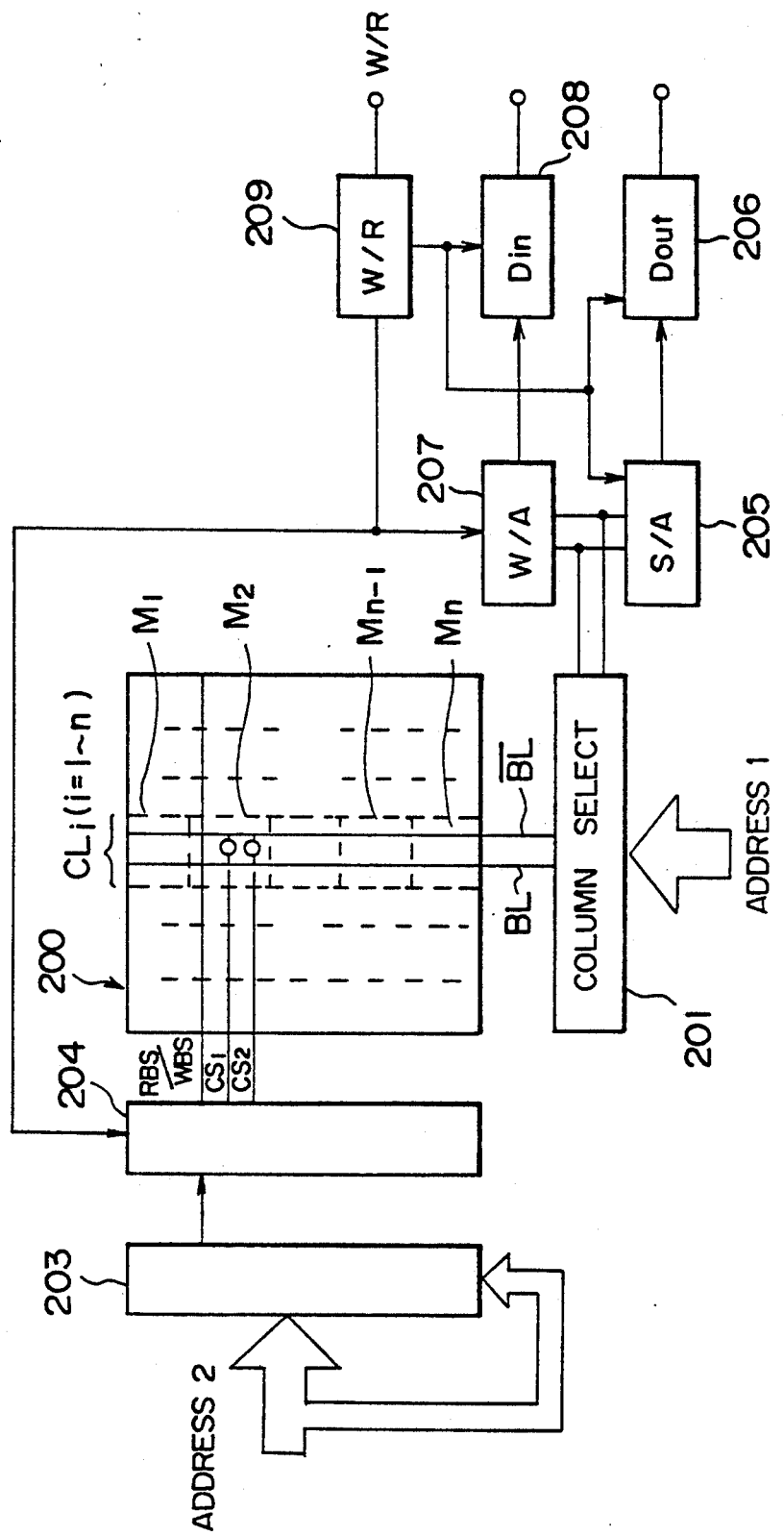
FIG. 5 is a block diagram showing the overall construction of the SRAM according to a first embodiment of the present invention.

FIG. 5 shows the general construction of the SRAM according to the present invention.

Referring to FIG. 5, the device of the present invention includes a memory cell array 200 that in turn includes a plurality of TFT memory cells to be described in detail later. As usual in the semiconductor memories, the memory cells are arranged into a plurality of memory cell columns $CL_1-CL_n$, wherein each memory cell column, such as a memory cell column $CL_i$, includes a plurality of memory cells. In the SRAM of the present invention, it should be noted that each memory cell column $Cl_i$ is divided into a plurality of memory cell groups $M_1-M_m$ each including a predetermined number of memory cells.

As usual in the semiconductor memory devices, there are provided a plurality of complementary bit lines BL and /BL in correspondence to the plurality of memory cell columns $CL_i$, and each complementary bit line includes a first bit line BL and a second bit line /BL for carrying complementary electric signals. Further, in order to select one of the memory cell columns, there is provided a first decoder 201 that is supplied with column address data ADDRESS1.

In the SRAM of the present invention, there is provided a second decoder 203 supplied with row address data ADDRESS2 for selecting one of the memory cell groups, such as the memory cell group $M_2$, that is included in the selected memory cell column. Further, the SRAM of FIG. 5 includes a third decoder 204 that is supplied with the row address data ADDRESS2 as well as an output of the second decoder 203 for selecting one of the memory cells that is included in the selected memory cell group $M_2$. The third decoder 204 further produces output signals RBS and WBS as will be discussed later.

In each memory cell group, there are provided a plurality of complementary sub-bit lines SBL and /SBL, wherein each complementary sub-bit line includes a first sub-bit line SBL and a second sub-bit line /SBL for carrying complementary electric signals. It should be noted that the sub-bit lines SBL and /SBL extend for a limited length and have a reduced parasitic capacitance.

In response to the selection of the memory cell group by the second decoder 203, the sub-bit lines SBL and /SBL are connected to the bit lines BL and /BL of the same memory cell column. Further, the selected memory cell is connected to the corresponding sub-bit lines SBL and /SBL in response to the selection by the third decoder 204. Thereby, the data stored in the selected memory cell is transferred to the selected bit lines BL and /BL in the form of electric signals, and transferred further to a sense amplifier 205 via the first decoder 201. After amplification in the sense amplifier 205, the data is sent to an output buffer circuit 206 as practiced commonly in the semiconductor memories.

When writing data, input data is supplied to an input buffer circuit 208 and transferred to a write amplifier 207. The output electric signal of the write amplifier indicative of the data to be written, is transferred to the selected bit lines BL and /BL via the first decoder 201 and further to the selected memory cell via the sub-bit lines SBL and /SBL of the selected memory cell group.

In order to control the read/write operation of the device, there is provided a read/write controller 209 supplied with a read/write control signal for controlling the sense amplifier 205 and the write amplifier 207 as well as the output buffer circuit 206 and the input buffer circuit 208.

Figure 6:
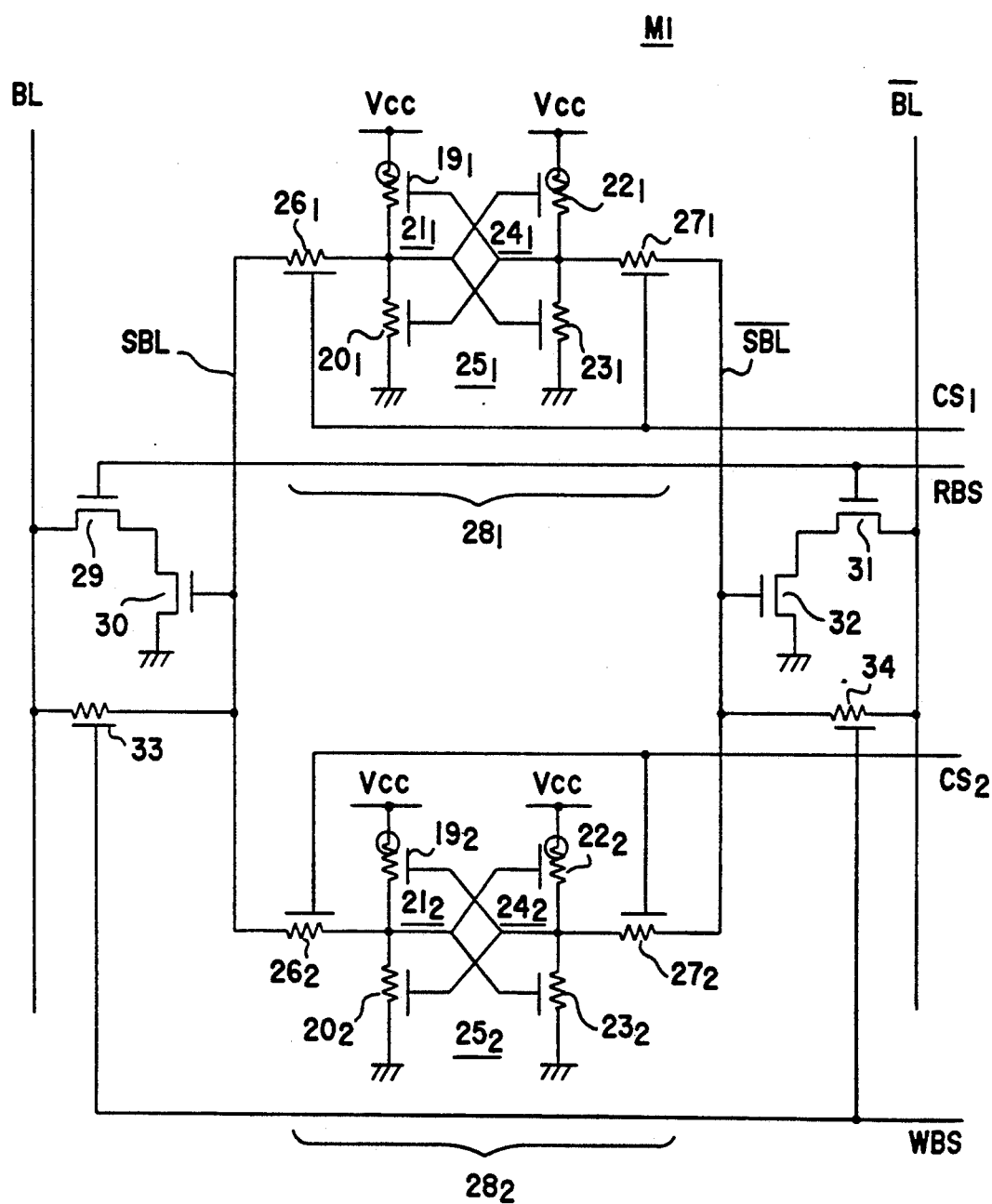
FIG. 6 is a circuit diagram showing the essential part of the SRAM of FIG. 5.

FIG. 6 shows the circuit diagram of the essential part of the device of FIG. 5 according to a first embodiment. It should be noted that FIG. 6 shows one of the memory cell groups such as the memory cell group $M_i$ together with the complementary bit lines BL and /BL of the memory cell column that includes the memory cell group $M_i$.

Referring to FIG. 6, there are provided first and second bulk MOS transistors 29 and 30 connected in series with each other across the first bit line BL and the ground, for causing an electric current to flow from the first bit line to the ground when the transistors 29 and 30 are both turned on. There, the first bulk MOS transistor 29 is turned on in response to an output RBS of the third decoder 204, while the second bulk MOS transistor 30 is connected to the first sub-bit line SBL so as to be turned on in response to an electric signal on the first sub-bit line SBL.

Similarly, there are provided third and fourth bulk MOS transistors 31 and 32 connected in series with each other across the second bit line /BL and the ground, for causing to flow an electric current from the second bit line to the ground when the transistors 31 and 32 are both turned on. There, the third bulk MOS transistor 31 is turned on in response to the aforementioned output signal RBS of the third decoder 204, while the fourth bulk MOS transistor 32 is connected to the second sub-bit line so as to be turned on in response to an electric signal on the second sub-bit line /SBL.

It should be noted that the first through fourth bulk MOS transistors 29–32 are turned on when reading data out from the memory cell. In this case, the voltage levels on the bit lines BL and /BL have to be changed in correspondence to the voltage levels on the sub-bit lines SBL and /SBL. More specifically, such a process of reading includes a process for discharging the bit lines BL and /BL. As the bulk MOS transistors, having the diffusion regions formed in the substrate and hence a large turn-on current, are used for such discharging, it will be noted that the discharging is achieved quickly even when the bit lines BL and /BL have a large parasitic capacitance. On the other hand, little electric current flows from the sub-bit lines SBL and /SBL to the MOS transistor 29 or 31. Thus, the construction of the memory cell as shown in FIG. 6 is particularly useful in the SRAMs that use TFTs for the memory cells.

Referring to FIG. 6 again, the memory cell group $M_i$ further includes a first selection TFT 33 provided across the first bit line BL and the first sub-bit line SBL for connecting the first bit line BL and the first sub-bit line SBL electrically when turned on. There, the first selection TFT 33 is turned on in response to an output signal WBS from the second decoder. Further, the memory cell group $M_i$ includes a second selection TFT 34 provided across the second bit line /BL and the second sub-bit line /SBL for connecting the second bit line /BL and the second sub-bit line /SBL electrically when turned on. There, the second selection TFT 34 is turned on in response to the aforementioned output signal WBS of the third decoder 204.

Next, the construction of the memory cell of the SRAM of the present invention will be described.

In the first embodiment shown in FIG. 6, each memory cell group $M_i$ includes two memory cells $28_1$ and $28_2$ having substantially an identical construction. There, the first memory cell $28_1$ includes a first p-channel TFT $19_1$ and a first n-channel TFT $20_1$ that are connected in series across a voltage source $V_{cc}$ and the ground. Thereby, the TFT $19_1$ and the TFT $20_1$ form a first CMOS inverter. Further, the memory cell $28_1$ includes a second p-channel TFT $22_1$ and a second n-channel TFT $23_1$ that are connected in series across the first voltage source $V_{cc}$ and the ground. Thereby, the TFT $22_1$ and the TFT $23_1$ form a second CMOS inverter. There, the first p-channel TFT $19_1$ and the first n-channel TFT $20_1$ have respective gates commonly connected to a node where the second p-channel TFT $22_1$ and the second n-channel TFT $23_1$ are connected with each other. Further, the second p-channel TFT $22_1$ and the second n-channel TFT $23_1$ have respective gates commonly connected to a node where the first p-channel TFT $19_1$ and the first n-channel TFT $20_1$ are connected with each other. Thereby, the first and second p-channel MOS transistors $19_1$ and $22_1$ and the first and second n-channel MOS transistors $20_1$ and $23_1$ form a flip-flop circuit. The same description applies also to the memory cell $28_2$.

The memory cell $28_1$ further includes a first transfer gate TFT $26_1$ provided between the node where the TFTs $19_1$ and $20_1$ are connected with each other and the first sub-bit line SBL for connecting the same electrically. There, the first transfer gate TFT $26_1$ is turned on in response to an output signal $CS_1$ of the third decoder 204. Similarly, there is provided a second transfer gate TFT $27_1$ between the node where the TFT $22_1$ and the TFT $23_1$ are connected with each other and the second sub-bit line /SBL for connecting the same with each other electrically when turned on. There, the second transfer gate TFT $27_1$ is turned on in response to the aforementioned output signal $CS_1$ of the third decoder 204.

Next, the operation of the SRAM of FIG. 6 will be described.

When reading data, the second decoder 203 supplies the group selection signal to the third decoder 204, and the third decoder produces and supplies the RBS signal to the selected memory cell group $M_i$. Thereby, the bulk MOS transistors 30 and 32 are turned on and the transistors 29 and 31 are connected to the bit lines BL and /BL. In this state, the $CS_1$ signal is supplied to the TFTs $26_1$ and $27_1$ from the third decoder 204. Thereby, the memory cell circuit $28_1$ is connected to the sub-bit lines SBL and /SBL, and the transistors 29 and 31 are turned on or turned off in response to the voltage level that appears on the sub-bit lines SBL and /SBL. When the transistor 29 is turned on, the electric charges on the bit line BL is discharged to the ground level quickly due to the large turn-on current of the bulk transistor 29, and the voltage level of the bit line BL changes to zero in a short time even when a large parasitic capacitance is connected to the bit line BL. When the transistor 31 is turned on, on the other hand, the voltage level of the bit line /BL changes to zero quickly.

When writing data to the memory cell $28_1$, the third decoder 204 supplies the WBS signal to the TFTs 33 and 34. Thereby, the bit lines BL and /BL are connected to the sub-bit lines SBL and /SBL and the voltage level on the bit lines BL and /BL is transferred to the sub-bit lines SBL and /SBL via the TFTs 33 and 34. There, the change of the voltage level occurs quickly on the sub-bit lines SBL and /SBL because of the reduced parasitic capacitance connected to these sub-bit lines SBL and /SBL, even when the turn-on current of the TFTs 33 and 34 is limited. In response to the supply of the selection signal $CS_1$, the transfer gate TFTs $26_1$ and $27_1$ are turned on and the state of the flip-flop circuit that forms the memory cell $28_1$ is changed in response thereto.

It should be noted that each of the p-channel TFTs $19_1$ and $22_1$, the n-channel TFTs $20_1$, $23_1$, $26_1$ and $27_1$, and the selection TFTs 33 and 34 has an elongate polysilicon strip provided above a semiconductor substrate. The elongate polysilicon strip is formed with an undoped region in correspondence to a channel region of a MOS transistor, and a pair of diffusion regions are provided at both sides of the channel region. There, the diffusion regions of the p-channel TFT are doped to the p-type, while the diffusion regions of the n-channel TFT are doped to the n-type. As will be described in detail below, the polysilicon strip forming the TFT is provided above the bulk transistors that have the diffusion regions formed in a semiconductor substrate.

Hereinafter, the construction of the circuit of FIG. 6 on a substrate will be described in detail with reference to FIGS. 7–21.

Figure 7:
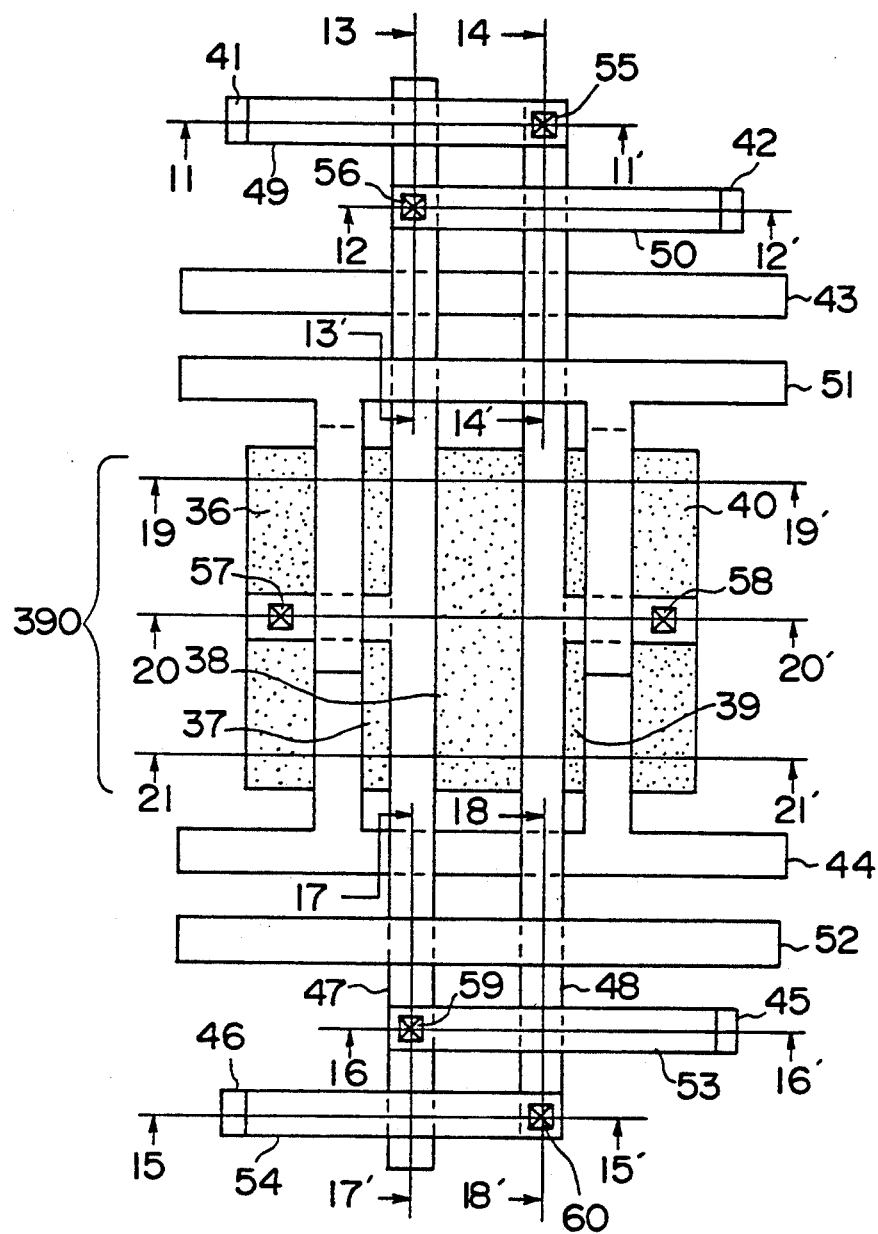
FIG. 7 is a plan view of the device of FIG. 6 showing the surface of a substrate and an interconnection pattern provided on the substrate.

Referring to FIG. 7 showing the SRAM of FIG. 6 in a plan view, there are provided $n^+$-type diffusion regions 36–40 on a surface of a single crystal substrate 400 (see FIGS. 19–21) of p-type silicon, wherein the diffusion regions 36 and 37 form respectively the drain and the source of the bulk MOS transistor 30, while the diffusion region 38 forms the source of the bulk MOS transistor 29. Thereby, the diffusion region 37 acts also as the drain of the bulk MOS transistor 29. Similarly, the diffusion regions 40 and 39 form respectively the drain and the source of the bulk MOS transistor 32. The diffusion region 39 acts also as the drain of the bulk MOS transistor 31, while the diffusion region 38 acts also as the source of the bulk MOS transistor 31.

On the surface of the substrate, there are provided first level polysilicon strips 41–46 isolated from the substrate by an insulation layer (not shown). Further, second level polysilicon strips 47 and 48 are provided above the first level polysilicon strips with an intervening insulation layer (not shown) formed between the first and second level polysilicon strips. Furthermore, there are provided third level polysilicon strips 49–54 above the second level polysilicon strips with an insulation layer (not shown) formed therebetween. Further, there are provided contact holes 55–60 for connecting the polysilicon strips with each other.

Figure 8:
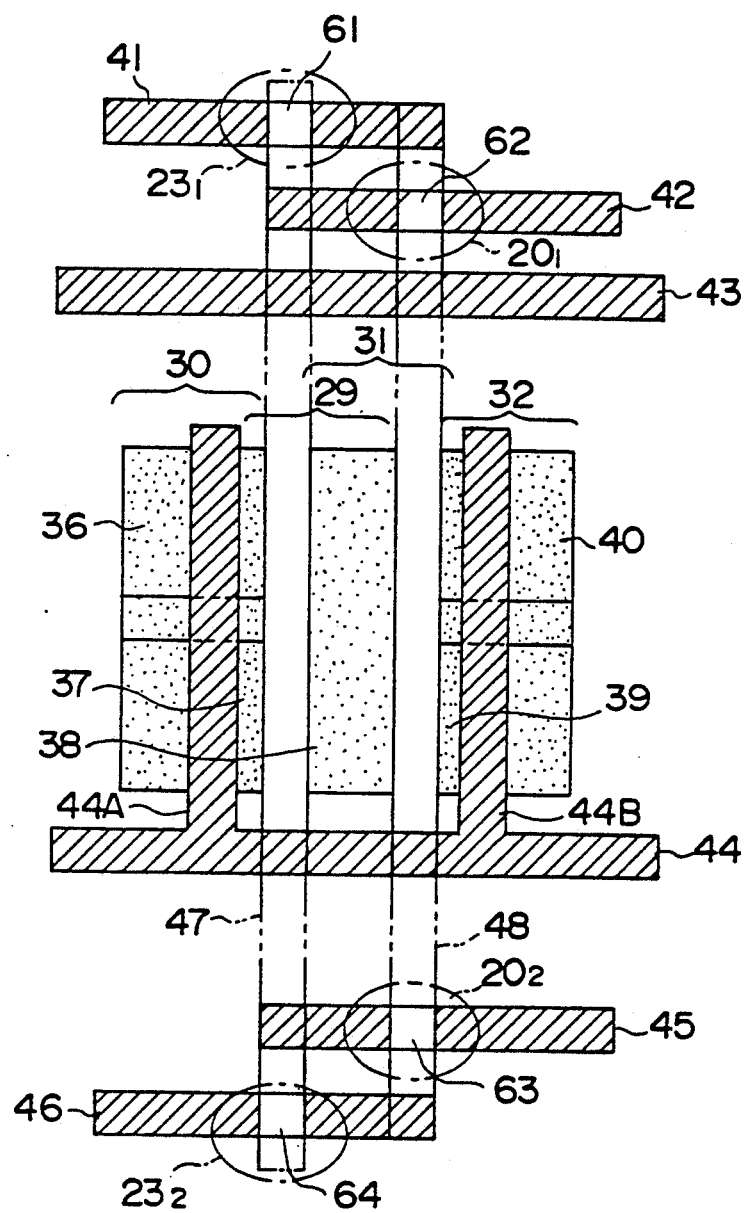
FIG. 8 is a plan view similar to FIG. 7 showing a first level polysilicon pattern provided on the surface of the substrate.

FIG. 8 shows the layout of the first level polysilicon strips 41–46.

Referring to FIG. 8, the polysilicon strips 41–46 extend generally laterally and are doped to the $n^+$-type except for regions 61, 62, 63 and 64 where the polysilicon strips intersect with the second level polysilicon strips 47 and 48 that extend vertically in the drawing. In FIG. 8, the region where the doping is achieved is indicated by the shading.

There, it will be noted that there is formed the n-channel TFT $23_1$ in correspondence to where the polysilicon strip 41 intersects with the polysilicon strip 47, with the channel region formed in correspondence to the undoped region 61. Similarly, there is formed the n-channel TFT $20_1$ in correspondence to where the polysilicon strip 42 intersects with the polysilicon strip 48, with the channel region formed in correspondence to the undoped region 62. Similarly, the n-channel TFTs $20_2$ and $23_2$ are formed respectively in correspondence to the undoped region 63 and in correspondence to the undoped region 64.

It will be noted that the polysilicon strip 44 has branched parts 44A and 44B each extending vertically in the drawing. In the substrate 400, there are formed undoped regions in correspondence to the branched parts 44A and 44B. There, the undoped region formed under the branched part 44A separates the diffusion region 36 from the diffusion region 37 and acts as the channel region of the bulk MOS transistor 30. Thereby, the branched part 44A of the polysilicon strip 44 acts as the gate electrode of the transistor 30. Similarly, the undoped region formed under the branched part 44B separates the diffusion region 39 from the diffusion region 40 and acts as the channel region of the bulk MOS transistor 32. Thereby, the branched part 44B acts as the gate electrode of the MOS transistor 32.

In addition, there is formed an undoped region under the second level polysilicon strip 47 such that the undoped region separates the diffusion region 37 from the diffusion region 38. Thereby, the undoped region acts as the channel region of the MOS transistor 29 and the second level polysilicon strip 47 acts as the gate electrode of the transistor 29. Further, there is formed an undoped region under the second level polysilicon strip 48 such that the undoped region separates the diffusion region 39 from the diffusion region 38. Thereby, the undoped region acts as the channel region of the MOS transistor 31 and the second level polysilicon strip 48 acts as the gate electrode of the second transistor 31.

Figure 9:
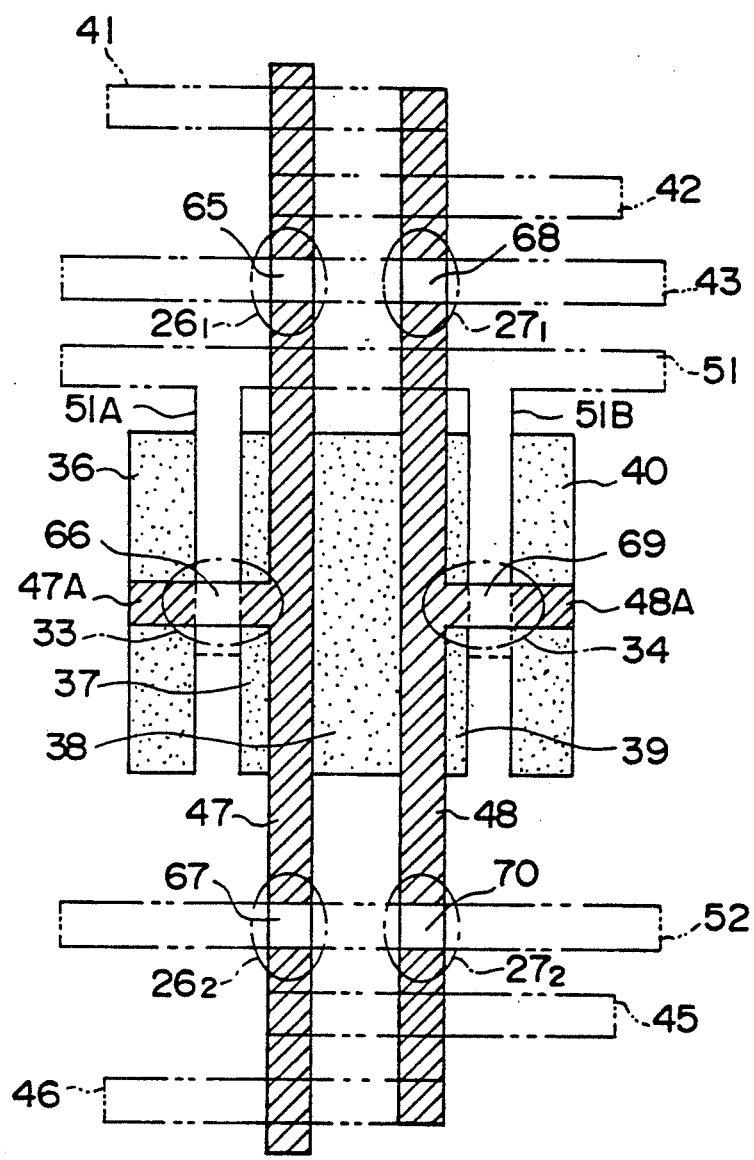
FIG. 9 is a plan view similar to FIG. 8 showing a second level polysilicon pattern provided above the first level polysilicon pattern of FIG. 8.

FIG. 9 shows the polysilicon pattern of the second level interconnection.

Referring to FIG. 9, the second level polysilicon strips 47 and 48 extend vertically in the drawing and are doped to the $n^+$-type as indicated by the shading, except for those parts 65, 67, 68 and 70 where the polysilicon strips intersect with the polysilicon strip 43 of the first level and the polysilicon strip 52 of the third level. There, the undoped region corresponding to the intersection 65 acts as the channel region of the transfer gate TFT $26_1$, while the undoped region corresponding to the intersection 68 acts as the channel region of the transfer gate TFT $27_1$. Further, the first level polysilicon strip 43 acts as the gate electrodes of the transistors $26_1$ and $27_1$ that are connected commonly for receiving the $CS_1$ signal from the third decoder 204. Similarly, the transfer gate TFTs $26_2$ and $27_2$ are formed respectively at the intersection between the polysilicon strip 47 and the polysilicon strip 52 of the third level and at the intersection between the polysilicon strip 48 and the polysilicon strip 52. Further, the polysilicon strips 47 and 48 have respective lateral extension parts 47A and 48A, wherein the lateral extension part 47A is formed with an undoped region 66 in correspondence to the channel region of the selection TFT 33. Similarly, the lateral extension part 48A is formed with an undoped region 69 in correspondence to the channel region of the selection TFT 34. It should be noted that the undoped regions 66 and 69 are formed respectively in correspondence to the intersection between the extension part 47A and a pattern 51A of the third level and in correspondence to the intersection between the extension part 48A and a pattern 51B of the third level.

Figure 10:
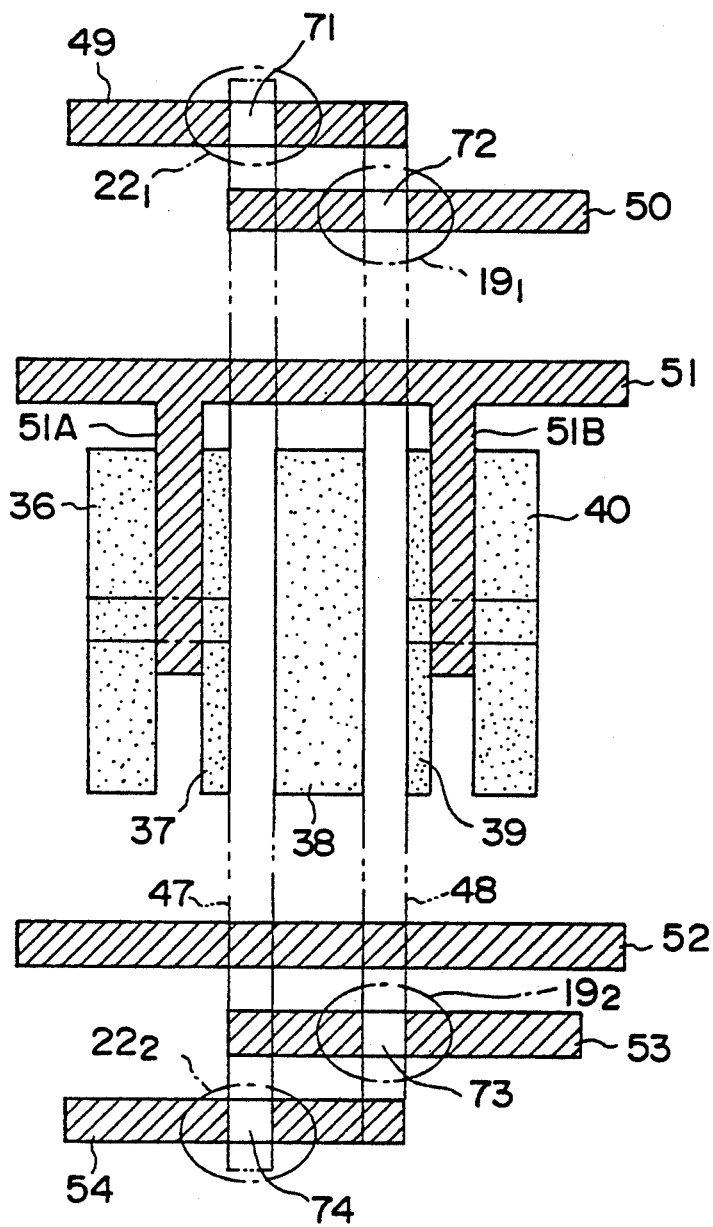
FIG. 10 is a plan view similar to FIG. 9 showing a third level polysilicon pattern provided above the second level polysilicon pattern of FIG. 9.

FIG. 10 shows the polysilicon pattern of the third level.

Referring to FIG. 10, there is provided a polysilicon strip 49 doped to the $p^+$-type above the $n^+$-type polysilicon strip 41 of the first level, with an undoped region 71 formed in correspondence to the intersection where the polysilicon strip 49 intersects with the polysilicon strip 47 of the second level. Thereby, the undoped region 71 acts as the channel region of the TFT $22_1$, while the polysilicon strip 47 acts as the gate of the TFT $22_1$. Similarly, there is provided a polysilicon strip 50 doped to the p+-type above the polysilicon strip 42 of the first level, with an undoped region 72 formed in correspondence to the intersection with the polysilicon strip 48 of the second level. Thereby, the undoped region 72 acts as the channel region of the TFT $19_1$ while the polysilicon strip 48 acts as the gate of the TFT $19_1$. Similarly there are formed p-channel TFTs $19_2$ and $22_2$ respectively in correspondence to the intersection where a p+-type polysilicon strip 54 and the polysilicon strip 47 intersects with each other and in correspondence to the intersection where a p+-type polysilicon strip 53 and the polysilicon strip 48 intersect with each other. There, an undoped region 74 formed in the polysilicon strip 54 in correspondence to the intersection acts as the channel region of the TFT $22_2$, while an undoped region 73 formed in the polysilicon strip 53 in correspondence to the intersection acts as the channel region of the TFT $19_2$.

It will be noted that the p-channel TFT $19_1$ is formed immediately above the n-channel TFT $20_1$. Similarly, the TFT $22_1$ is formed immediately above the TFT $23_1$, the TFT $19_2$ is formed immediately above the TFT $20_2$, and the TFT $22_2$ is formed immediately above the TFT $23_2$. Thereby, the part of the polysilicon strip 47 that intersects with the polysilicon strips 41 and 49 acts simultaneously as the gate electrode of the p-channel TFT $22_1$ and the gate electrode of the n-channel TFT $23_1$. Similarly, the part of the polysilicon strip 48 that intersects with the polysilicon strips 42 and 50 acts simultaneously as the gate electrode of the p-channel TFT $19_1$ and the n-channel TFT $20_1$. Further, the part of the polysilicon strip 47 that intersects with the polysilicon strips 46 and 54 acts simultaneously as the gate electrode of the p-channel TFT $22_2$ and the n-channel TFT $23_2$. The part of the polysilicon strip 48 that intersects with the polysilicon strips 45 and 53 acts simultaneously as the gate electrode of the p-channel TFT $19_2$ and the n-channel TFT $20_2$.

Figure 11:
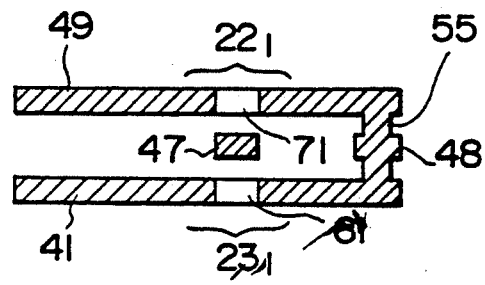
FIG. 11 is a cross sectional view of the SRAM device taken along a line 11—11' of FIG. 7.

FIG. 11 shows the cross sectional view taken along the line 11—11' of FIG. 7. As can be seen from this diagram, the polysilicon strip 41 of the first level and the polysilicon strip 49 of the third level are interconnected via the polysilicon strip 48 of the second level at the contact hole 55. Thereby, the transistors $22_1$ and $23_1$ are connected in series to form the CMOS inverter that forms the flip-flop circuit of the memory cell $28_1$.

Figure 12:
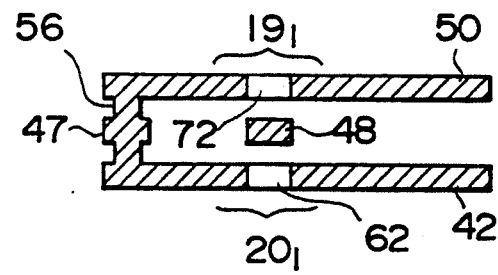
FIG. 12 is a cross sectional view of the SRAM device taken along a line 12—12' of FIG. 7.

FIG. 12 shows the cross sectional view taken along the line 12—12' of FIG. 7. As can be seen from this diagram, the polysilicon strip 42 of the first level and the polysilicon strip 50 of the third level are interconnected via the polysilicon strip 47 of the second level at the contact hole 56. Thereby, the transistors $19_1$ and $20_1$ are connected in series to form the other CMOS inverter that forms the flip-flop circuit of the memory cell $28_1$.

Figure 13:
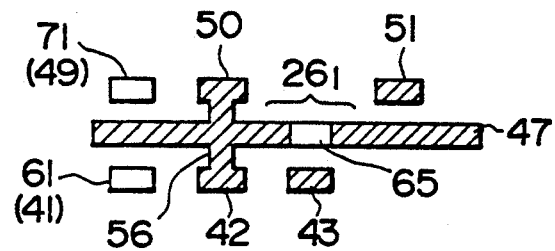
FIG. 13 is a cross sectional view of the SRAM device taken along a line 13—13' of FIG. 7.
Figure 14:
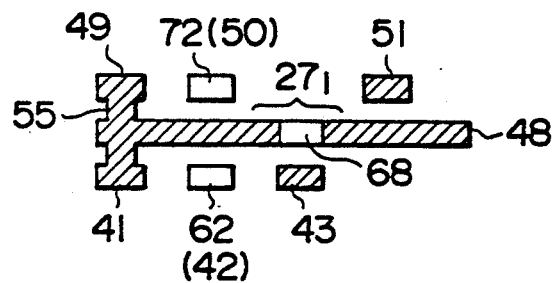
FIG. 14 is a cross sectional view of the SRAM device taken along a line 14—14' of FIG. 7.

FIG. 13 shows the cross sectional view taken along the line 13—13' of FIG. 7. This diagram shows that the transfer gate TFT $26_1$ is formed in the polysilicon strip 47. Similarly, FIG. 14 shows the cross sectional view taken along the line 14—14' of FIG. 7. This diagram shows that the transfer gate TFT $27_1$ is formed in the polysilicon strip 48.

Figure 15:
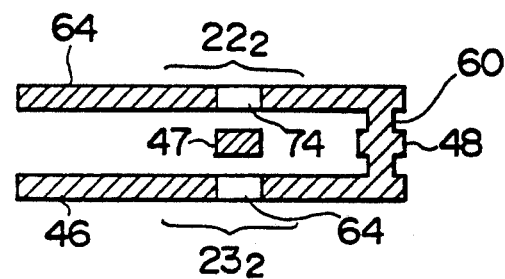
FIG. 15 is a cross sectional view of the SRAM device taken along a line 15—15' of FIG. 7.
Figure 16:
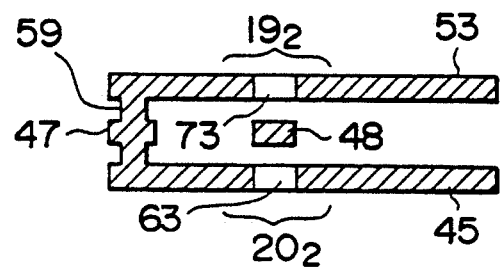
FIG. 16 is a cross sectional view of the SRAM device taken along a line 16—16' of FIG. 7.

FIG. 15 is a diagram similar to FIG. 11 and shows the device of FIG. 7 in the cross section taken along the line 15—15'. There, it will be noted that the polysilicon strip 46 at the first level and the polysilicon strip at the third level 54 are interconnected with each other via the polysilicon strip 48 of the second level at the contact hole 60. Thereby, the transistors $22_2$ and $23_2$ are connected in series to form the CMOS inverter that forms the flip-flop circuit of the memory cell $28_2$. Similarly, FIG. 16 shows the cross sectional view taken along the line 16—16' of FIG. 7 and shows the interconnection of the polysilicon strip 45 of the first level to the polysilicon strip 53 of the third level via the polysilicon strip 47 of the second level at the contact hole 59. Thereby, the transistors $19_2$ and $20_2$ are connected in series to form the other CMOS inverter that forms the flip-flop circuit of the memory cell $28_2$.

Figure 17:
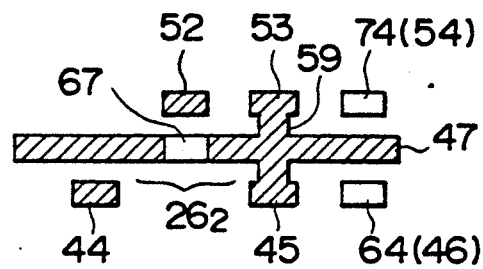
FIG. 17 is a cross sectional view of the SRAM device taken along a line 17—17' of FIG. 7.
Figure 18:
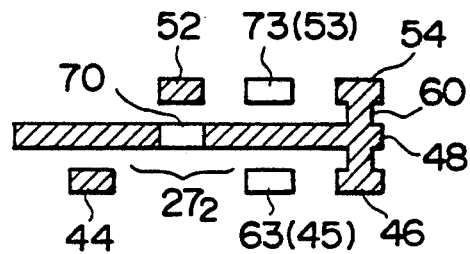
FIG. 18 is a cross sectional view of the SRAM device taken along a line 18—18' of FIG. 7.

FIG. 17 is a diagram corresponding to FIG. 13 and shows the cross section taken along the line 17—7'. There, it will be seen that the transfer gate TFT $26_2$ is formed on the conductor strip 47. Similarly, FIG. 18 corresponds to the cross sectional view of FIG. 14 and shows the cross section of the device of FIG. 7 taken along the line 18—18'. There, it will be seen that the transfer gate TFT $27_2$ is formed on the polysilicon strip 48.

Figure 19:
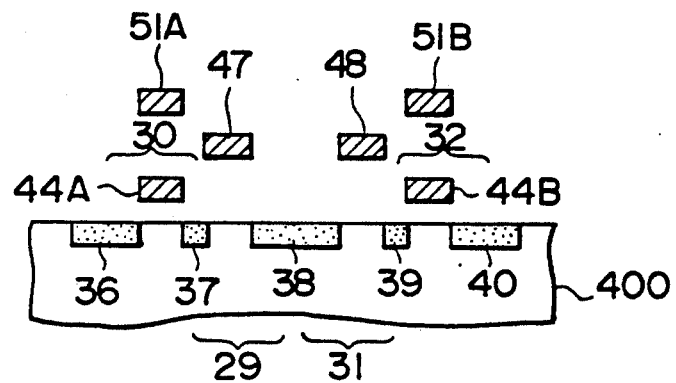
FIG. 19 is a cross sectional view of the SRAM device taken along a line 19—19' of FIG. 7.

FIG. 19 shows the cross sectional view taken along the line 19—19' of FIG. 7, showing the essential part of the bulk transistors 29-32. Referring to FIG. 19, it will be seen that the first level polysilicon strip 44A acts as the gate electrode of the MOS transistor 30 while the second level polysilicon strip 47 acts as the gate electrode of the MOS transistor 29. Further, it will be seen that the first level polysilicon strip 44B acts as the gate electrode of the MOS transistor 32, while the second level polysilicon strip 48 acts as the gate electrode of the MOS transistor 31. The diffusion region 37 is used commonly by the transistor 29 and the transistor 30. In other words, the transistors 29 and 30 are connected in series. Similarly, the diffusion region 39 is used commonly by the transistors 31 and 32, indicating that the transistors 31 and 32 are connected in series.

Figure 20:
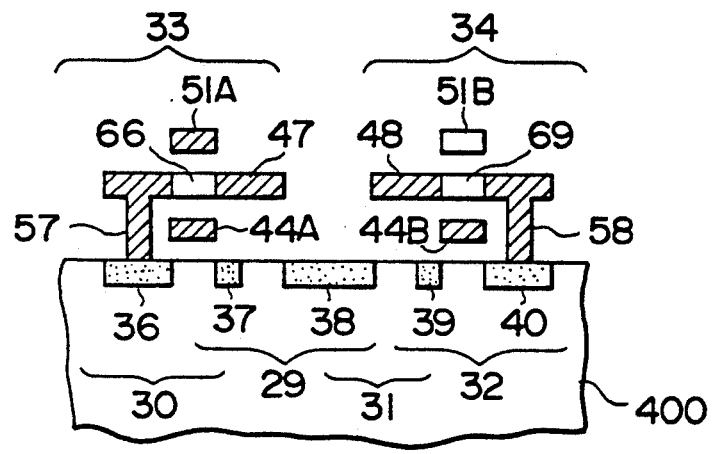
FIG. 20 is a cross sectional view of the SRAM device taken along a line 20—20' of FIG. 7.

FIG. 20 shows the cross sectional view taken along the line 20—20' of FIG. 7. There, it will be seen that the polysilicon pattern 51A acts as the gate electrode of the selection TFT 33, and the diffusion region 36 that acts as the source of the bulk MOS transistor 30 is connected to the source of the TFT 33 via the contact hole 57. Similarly, the polysilicon pattern 51B acts as the gate electrode of the selection TFT 34, and the diffusion region 40 that acts as the source of the bulk MOS transistor 32 is connected to the source of the TFT34 via the contact hole 58.

Figure 21:
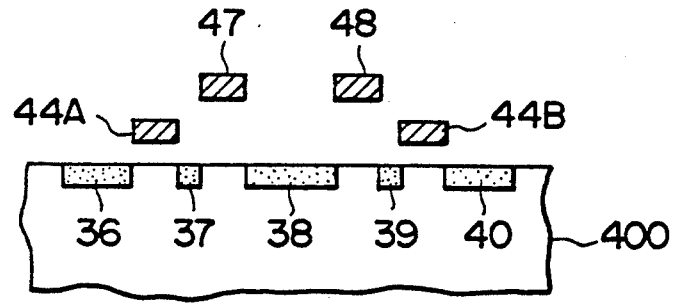
FIG. 21 is a cross sectional view of the SRAM device taken along a line 21—21' of FIG. 7.

FIG. 21 shows the cross sectional view taken along the line 21—21' of FIG. 7. This cross section is substantially identical with the cross section of FIG. 19 except that it lacks the polysilicon patterns 51A and 51B that are interrupted. See FIG. 10.

In the description so far, it will be noted that the undoped region formed at the intersection of two polysilicon strips and acting as the channel region of TFT, is not necessarily a region of the intrinsic type but may be doped lightly as usual in MOS transistors. This applies also to the TFTs that are used in the SRAM of other embodiments described below.

Next, a second embodiment of the present invention will be described.

Figure 22:
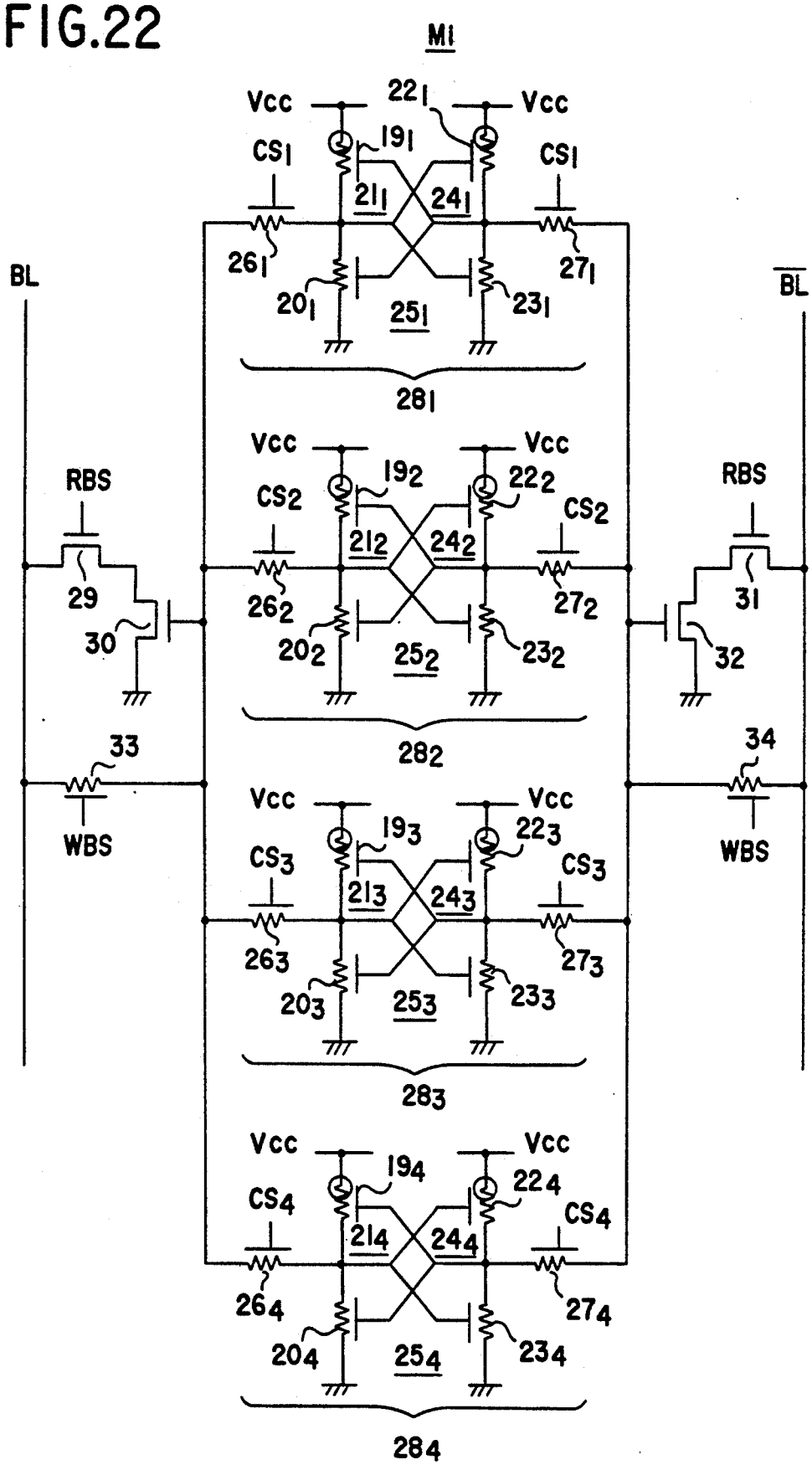
FIG. 22 is a circuit diagram showing the construction of the SRAM according to a second embodiment of the present invention.

FIG. 22 shows the circuit diagram of the SRAM of the second embodiment. In the present embodiment, in each memory cell group, there are formed four memory cells $28_1$–$28_4$ each having the same construction. As the construction of the individual parts of the SRAM circuit is identical with the first embodiment, further description concerning the circuit diagram will be omitted.

Figure 23:
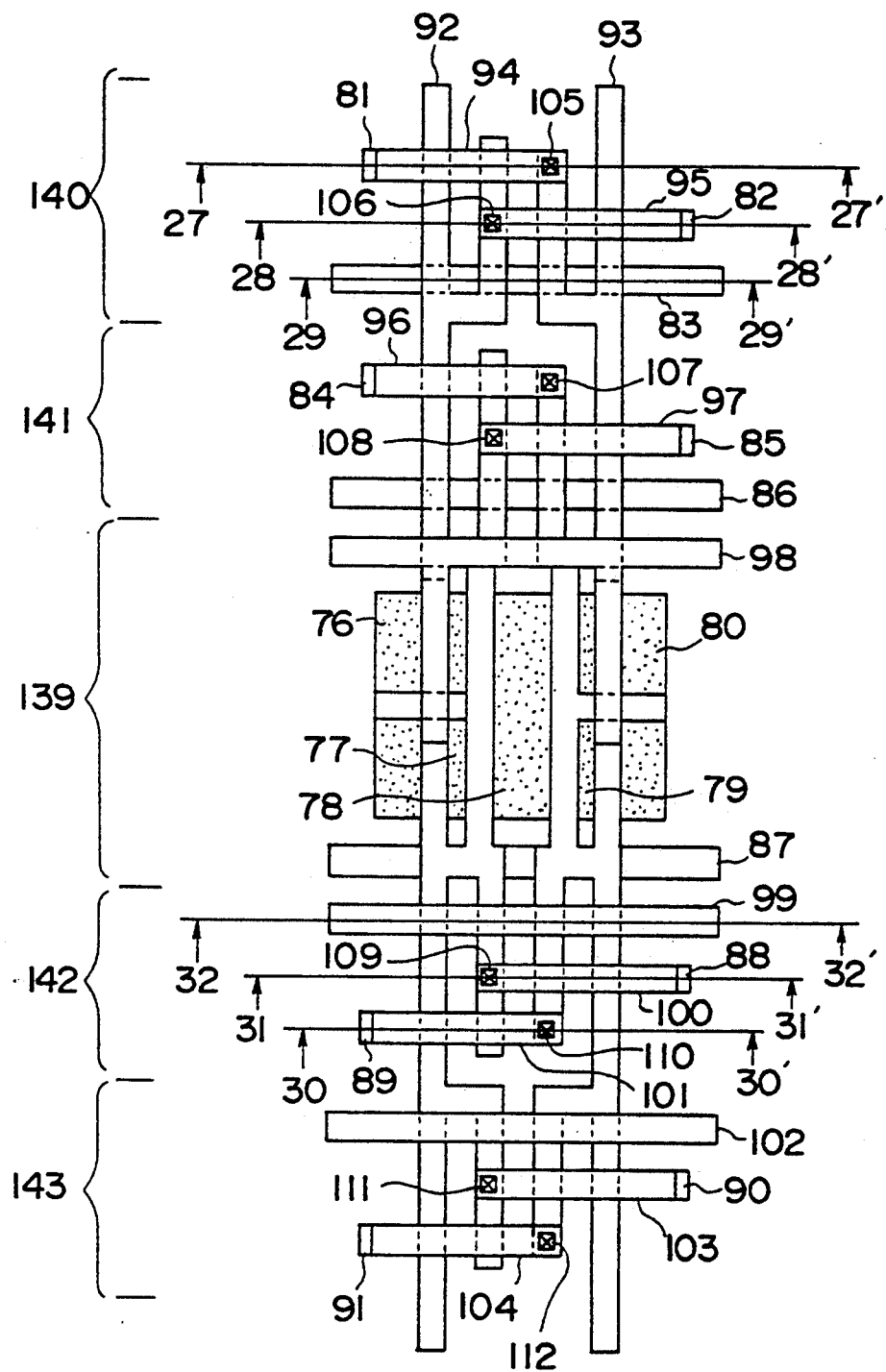
FIG. 23 is a plan view of the device of FIG. 22 showing a substrate and an interconnection pattern provided on the surface of the substrate.

FIG. 23 shows a plan view of one memory cell group that forms the SRAM of the second embodiment.

Referring to FIG. 23, it will be seen that the memory cell group is divided into five structural units 139–143, wherein the structural units 140–143 have substantially same polysilicon pattern layouts. In the description below, therefore, only the layout of the structural unit 140 will be described and the description for other structural units will be omitted.

In FIG. 23, it will be noted further that the layout of the structural unit 139 is substantially identical with the part of the layout of FIG. 7 shown by the numeral 390. There, the structural unit 139 includes diffusion regions 76–80, wherein the diffusion region 76 corresponds to the diffusion region 36, the diffusion region 77 corresponds to the diffusion region 37, the diffusion region 78 corresponds to the diffusion region 38, the diffusion region 79 corresponds to the diffusion region 39, and the diffusion region 80 corresponds to the diffusion region 40. Thus, further description concerning the structural unit 139 will be omitted.

Figure 24:
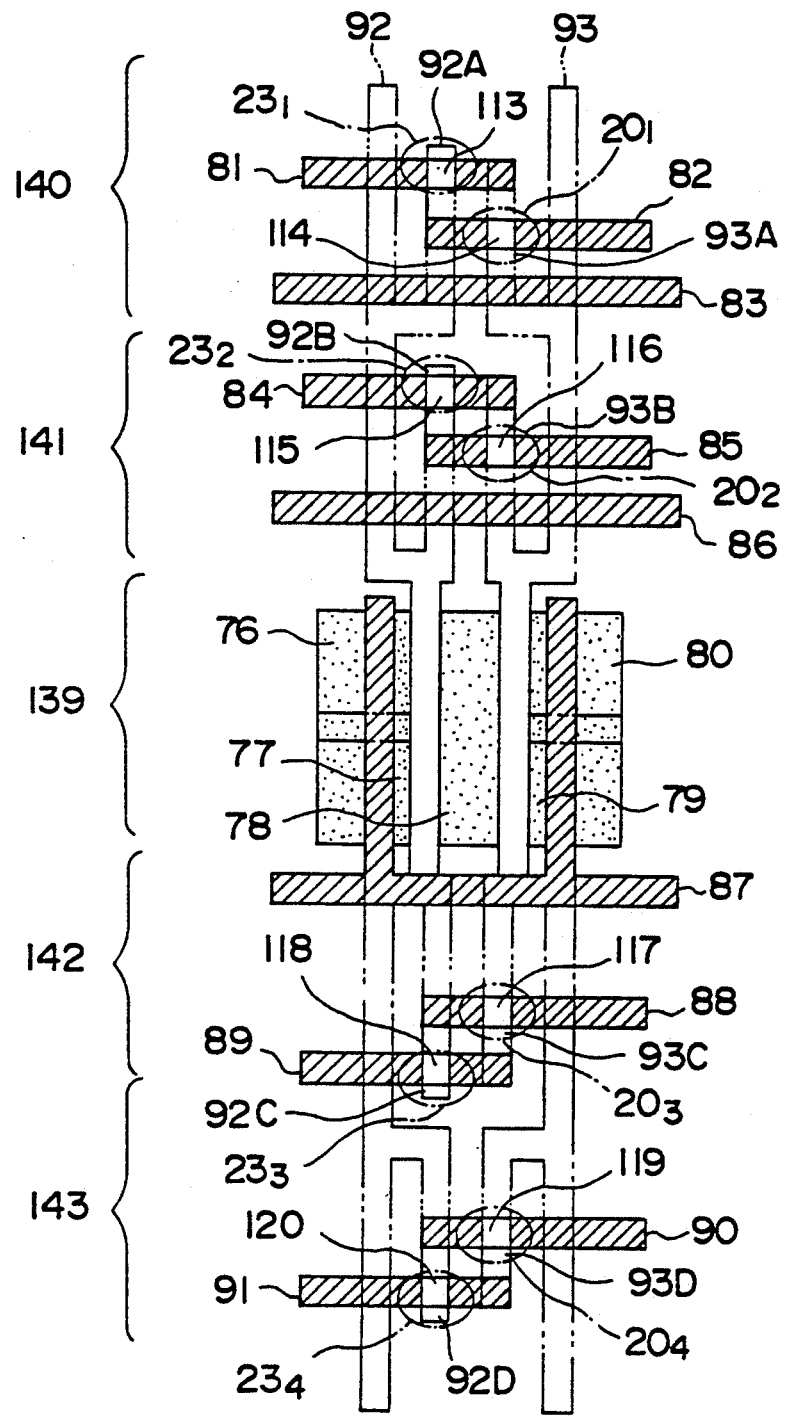
FIG. 24 is a plan view similar to FIG. 23 showing a first level polysilicon pattern provided on the surface of the substrate.

FIG. 24 shows the layout of the polysilicon strip of the first level.

Referring to FIG. 24, there are provided polysilicon strips 81, 82 and 83 on the substrate 400 to extend laterally, wherein the polysilicon strip 81 is doped to the $n^+$-type except for an undoped region 113 that corresponds to the channel region of the n-channel TFT $23_1$. Similarly, the polysilicon strip 82 is doped to the $n^+$-type except for an undoped region 114 that corresponds to the channel region of the n-channel TFT $20_1$. On the other hand, the polysilicon strip 83 is doped to the $n^+$-type along its entire length.

Figure 25:
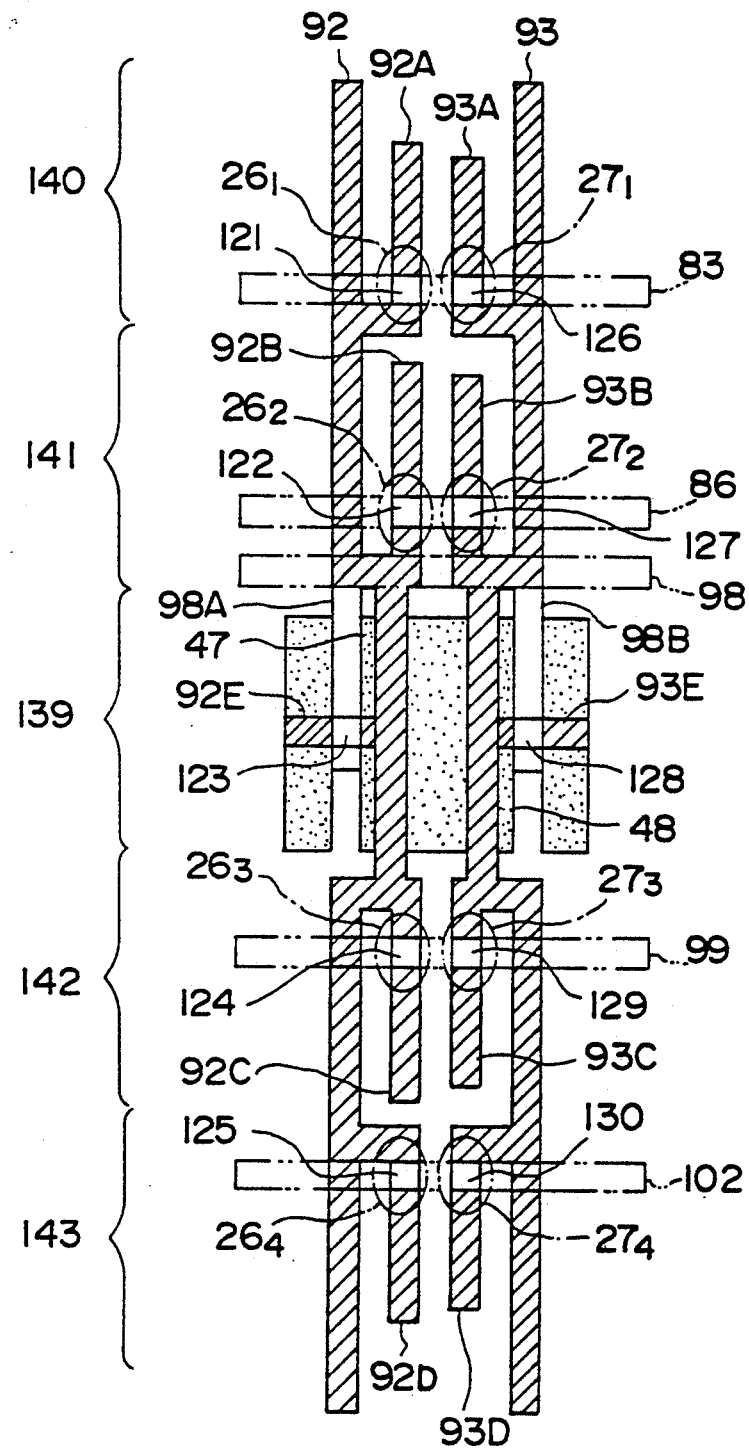
FIG. 25 is a plan view similar to FIG. 24 showing a second level polysilicon pattern provided above the first level polysilicon pattern.

FIG. 25 shows the layout of the second level pattern.

Referring to FIG. 25, there are provided polysilicon strips 92 and 93 extending vertically as the extension part of the polysilicon strips 47 and 48 of the structural unit 139. There, the polysilicon strips 92 and 93 have respective branches 92A and 93A extending vertically, wherein the vertical branch 92A intersects with the polysilicon strip 81 of the first level in correspondence to the undoped region 113 of FIG. 24. Similarly, the vertical branch 93A intersects with the polysilicon strip 82 of the first level in correspondence to the undoped region 114 of FIG. 24. The polysilicon strips 92 and 93 as well as the branches 92A and 92B are doped to the $n^+$-type except for an undoped region 121 where the branch 92A intersects with the polysilicon pattern 83 of the first level and an undoped region 126 where the branch 92B intersects with the polysilicon pattern 83. In correspondence to the undoped regions 121 and 126, the transfer gate TFTs $26_1$ and $27_1$ are formed, wherein the undoped region 121 acts as the channel region of the TFT $26_1$ and the undoped region 126 acts as the channel region of the TFT $27_1$.

Figure 26:
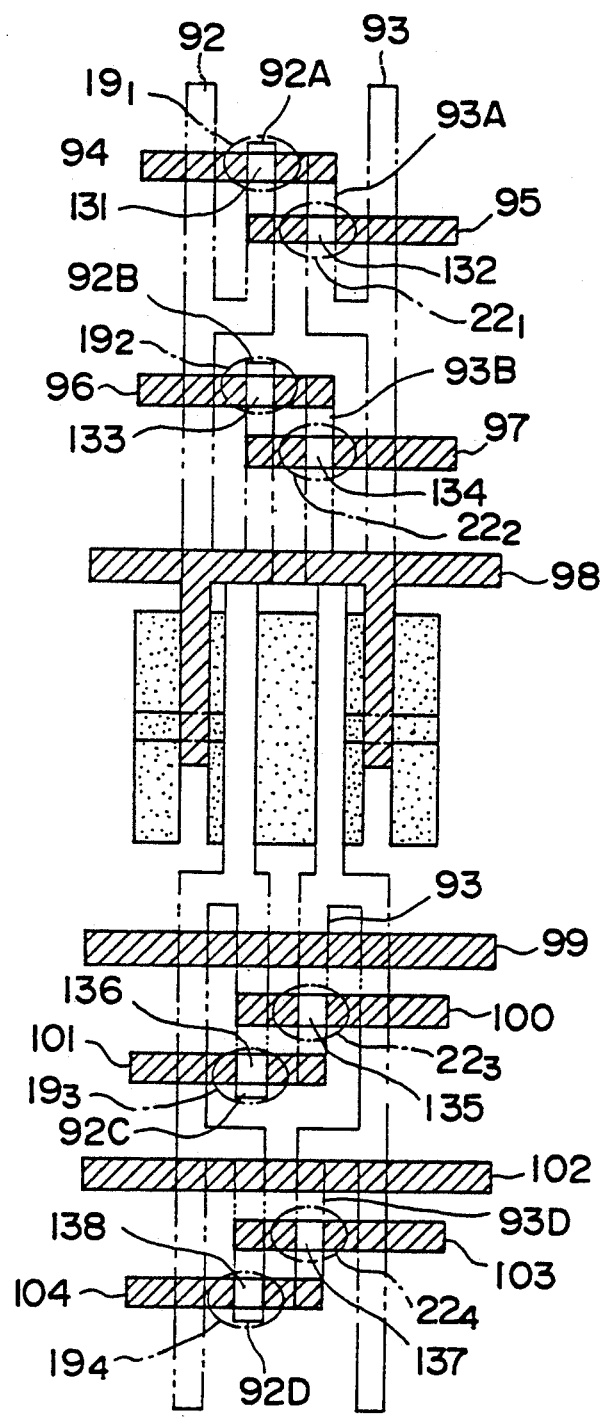
FIG. 26 is a plan view similar to FIG. 25 showing a third level polysilicon pattern provided above the second level polysilicon pattern.

FIG. 26 shows the polysilicon pattern of the third level.

Referring to FIG. 26, there are provided a pair of polysilicon strips 94 and 95 extending parallel to each other in the lateral direction of the drawing. There, the polysilicon strip 94 is doped to the $p^+$-type except for an undoped region 131 formed in correspondence to the intersection between the polysilicon strip 94 and the polysilicon strip 92A of the second level. Thereby, the undoped region 131 acts as the channel region of the p-channel TFT $22_1$. Similarly, the polysilicon strip 95 is doped to the $p^+$-type except for an undoped region 132 formed in correspondence to the intersection between the polysilicon strip 95 and the polysilicon strip 93A of the second level. There, the undoped region 132 acts as the channel region of the p-channel TFT $19_1$.

Figure 27:
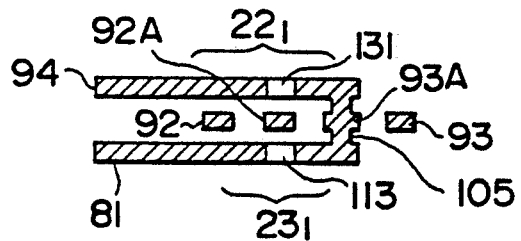
FIG. 27 is a cross sectional view of the SRAM device taken along a line 27—27' of FIG. 23.

FIG. 27 shows the cross section of the structure of FIG. 23 taken along a line 27—27'. From this diagram, it will be seen that the polysilicon strip 94 of the third level and the polysilicon strip 81 of the first level are connected with each other via the polysilicon strip 93A of the second level at the contact hole 105. Thereby, the p-channel TFT $22_1$ and the n-channel TFT $23_1$ are connected with each other in series to form the CMOS inverter that forms the flip-flop circuit of the memory cell $28_1$.

Figure 28:
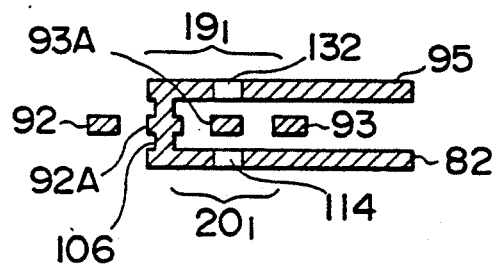
FIG. 28 is a cross sectional view of the SRAM device taken along a line 28—28' of FIG. 23.

Similarly, FIG. 28 shows the cross sectional view of FIG. 23 taken along a line 28—28'. There, it will be noted that the polysilicon strip 95 of the third level and the polysilicon strip 82 of the first level are connected with each other via the polysilicon strip 92A of the second level at the contact hole 106. Thereby, the p-channel TFT $19_1$ and the n-channel TFT $20_1$ are connected in series to form the other CMOS inverter that forms the flip-flop circuit of the memory cell $28_1$.

Figure 29:
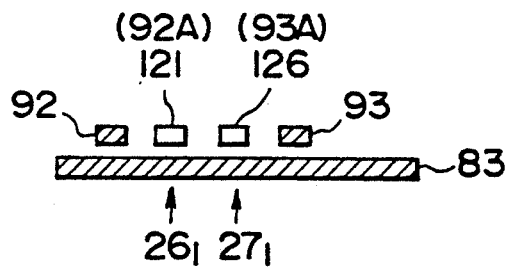
FIG. 29 is a cross sectional view of the SRAM device taken along a line 29—29' of FIG. 23.

FIG. 29 shows the cross section of the structure of FIG. 23 taken along the line 29—29'. It will be noted that there are formed the undoped regions 121 and 126 in the second level polysilicon strips 92A and 93A respectively in correspondence to the transfer gate TFTs $26_1$ and $27_1$.

Figure 30:
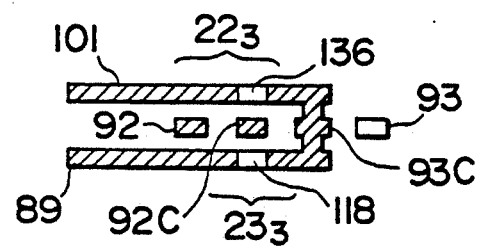
FIG. 30 is a cross sectional view of the SRAM device taken along a line 30—30' of FIG. 23.
Figure 31:
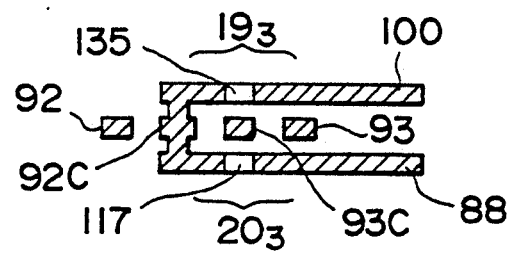
FIG. 31 is a cross sectional view of the SRAM device taken along a line 31—31' of FIG. 23.
Figure 32:
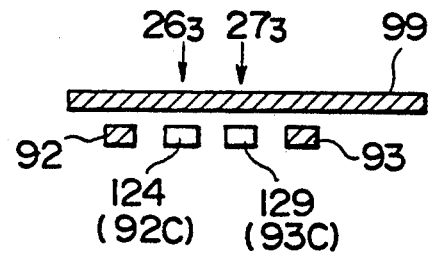
FIG. 32 is a cross sectional view of the SRAM device taken along a line 32—32' of FIG. 23.

FIGS. 30–32 are the diagrams corresponding to FIGS. 27–29 respectively showing the cross section of the structure of FIG. 23 taken along the lines 30—30', 31—31' and 32—32'. As these diagrams show, the structures are substantially identical with the structures of FIGS. 27–29, and hence further description will be omitted, except for one point that FIG. 32 shows the formation of transfer gate TFTs $26_3$ and $27_3$ in correspondence to an intersection between second level polysilicon strips 92C and 93C and a third level polysilicon strip 99. There, the polysilicon strips 92C and 93C correspond to the branched polysilicon strips 92A and 93A respectively, while the polysilicon strip 99 corresponds to the polysilicon strip 83, except of course for the level where the polysilicon strip is provided.

Figure 33:
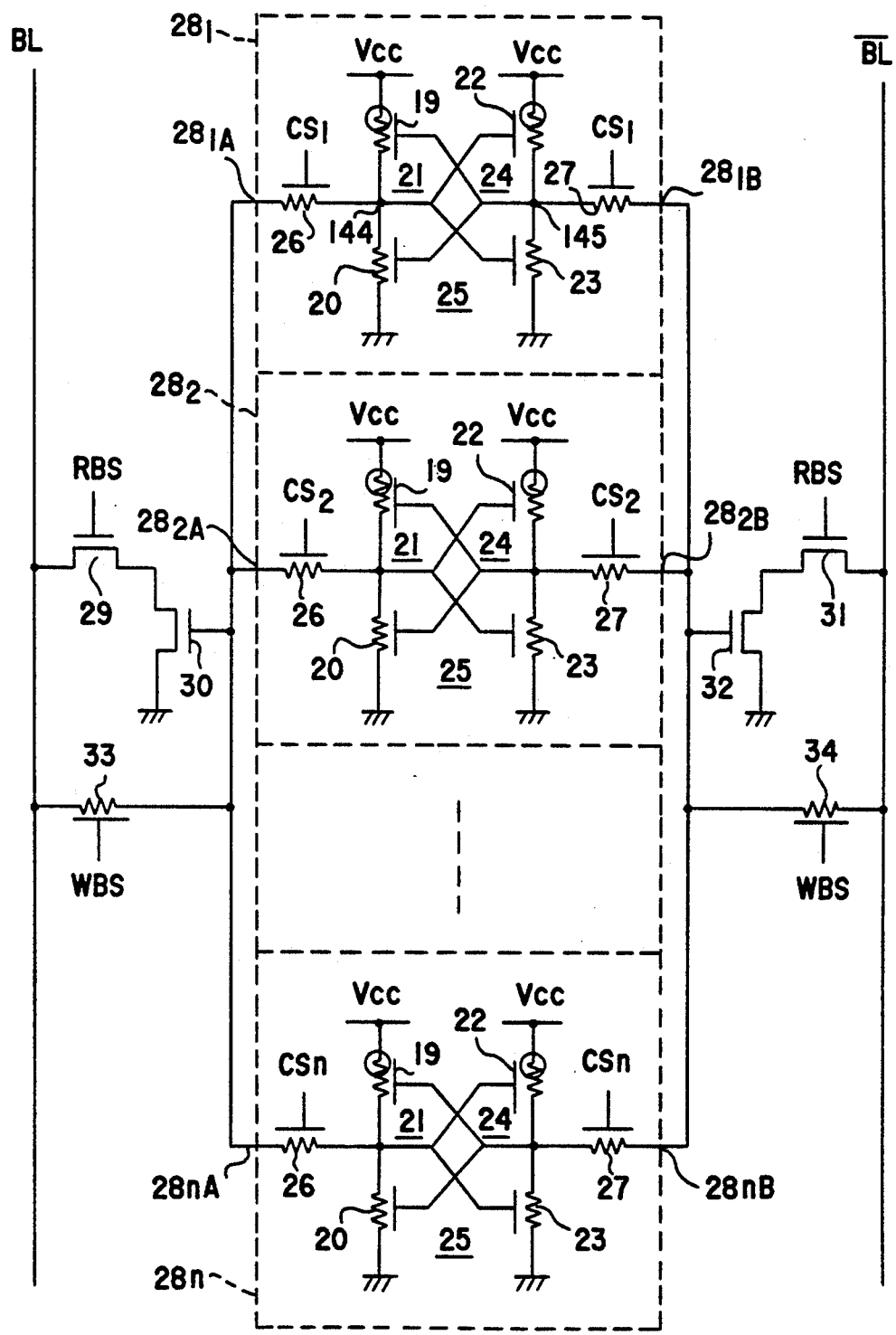
FIG. 33 is a circuit diagram of the SRAM similar to FIGS. 6 and 22 showing a generalized form of the circuit of the SRAM of the present invention.

By repeating the structural unit 141–143 a number of times, one can increase the number of memory cells that is included in one memory cell group. Thereby, the memory cell group shown in FIG. 33 can be obtained, wherein there are n memory cells included in one memory cell group. Because of the limitation of the turn-on current of the TFTs, the number of the memory cells that are included in one memory cell group is limited as already explained. Preferably, the number of the memory cells in one memory cell group is set equal to or smaller than 40, preferably smaller than 16.

Figure 34:
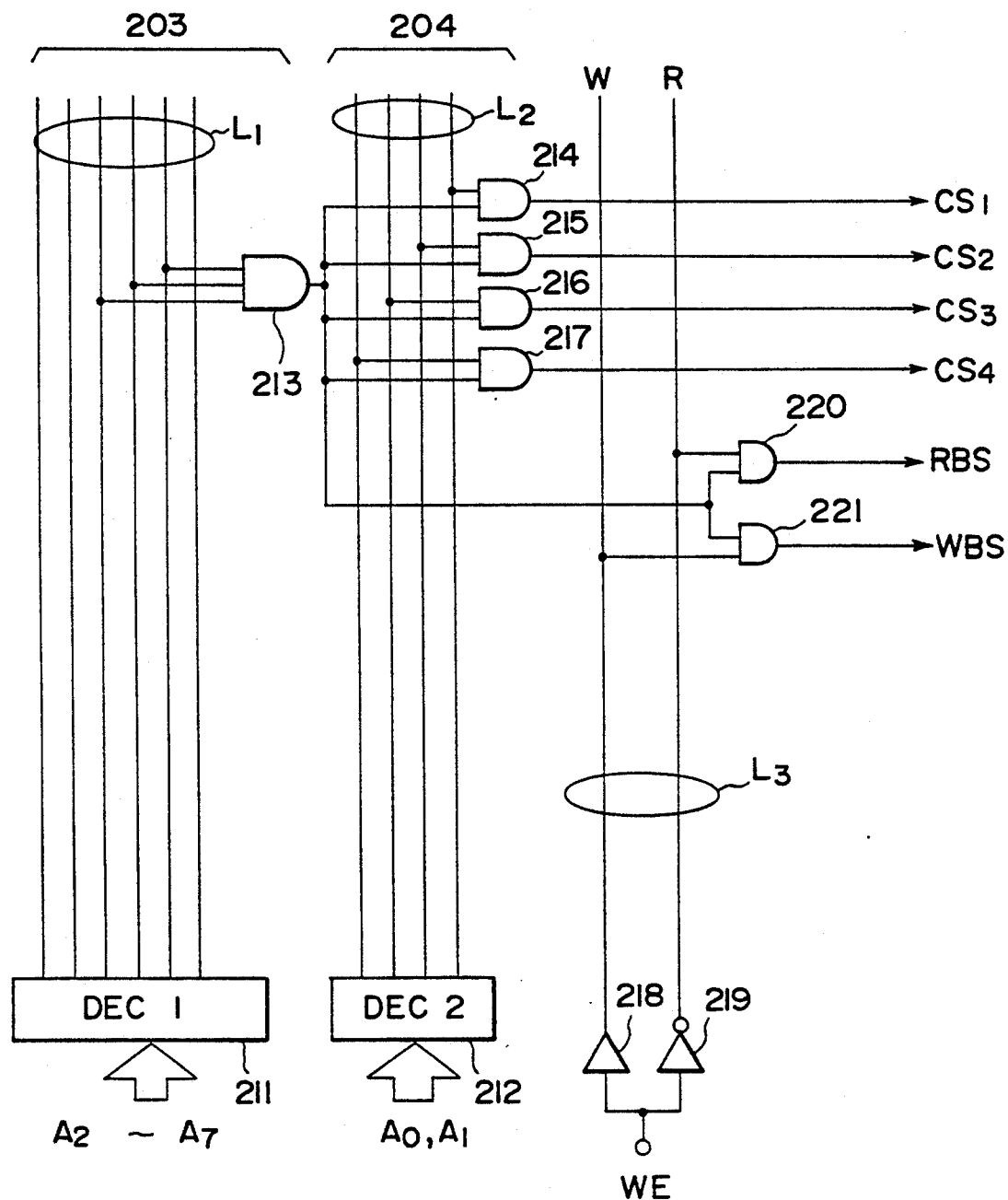
FIG. 34 is a circuit diagram showing the construction of the row decoders shown in the block diagram of FIG. 5.

Next, the construction of the second and third decoders 203 and 204 shown in the circuit diagram of FIG. 5 will be described briefly with reference to FIG. 34. It should be noted that the example of FIG. 34 is designed for driving the SRAM of the second embodiment. However, the construction of FIG. 34 can be modified easily for driving the SRAM of FIG. 33 wherein an arbitrary number of memory cells are included in one memory cell group.

Referring to FIG. 34 showing the second and third decoders 203 and 204 together, the row address data includes eight-bit data, $A_0$-$A_7$, wherein the data $A_2$-$A_7$ are supplied to a first pre-decoder unit 211, while the data $A_0$ and $A_1$ are supplied to a second predecoder unit 212. There, the first decoder unit 211 includes three 2×4 decoders respectively supplied with data $A_2$ and $A_3$, $A_4$ and $A_5$, and $A_6$ and $A_7$ for producing four bit data representing the logic product of the input data. Thereby, twelve bit data formed from three four-bit data is outputted on an output line $L_1$. On the other hand, the second decoder unit 212 is another 2×4 decoder and produces four bit binary output signals on an output line $L_2$ in response to the logic combination of the input data $A_0$ and $A_1$. Further, there are provided a non-inverting buffer 218 and an inverter 219 for receiving a write enable signal WE. There, the buffer 218 and the inverter 219 are connected to respective lines of an output line $L_3$ and output respective output signals W and R in response to the write enable signal WE, wherein the output signal W of the buffer 218 has the same logic level as the write enable signal WE, while the output signal R of the inverter 219 has the inverted logic level of the signal WE.

In correspondence to the output line $L_1$, there are provided a number of AND gates 213, FIG. 34 shows only one such gate for the sake of simplicity. There, the AND gate 213 produces an output signal in correspondence to a predetermined combination of the logic signals on the output line $L_1$, and the output signal of the AND gate 213 is supplied to four different AND gates 214-217 that are connected to respective lines of the output line $L_2$. In response to the high level output of the AND gate 213, the AND gates 214-217 are enabled, and one of the AND gates such as the gate 214, which is connected to the line of the output line $L_2$, produces a cell selection signal such as the $CS_1$.

In addition, the output signal of the AND gate 213 is supplied to the AND gates 220 and 221, wherein the AND gate 220 produces the RBS signal in response to the high level of the signal R outputted from the inverter 219. On the other hand, the AND gate 221 produces the WBS signal in response to the high level of the signal W produced by the buffer 218. Thereby, the AND gate 213 and the AND gates 220 and 221 form the second decoder 203 while the AND gates 214-217 form the third decoder 204.

Further, the present invention is not limited to the embodiments described heretofore, but various variations and modifications may be made without departing from the scope of the invention.

What is claimed is:

1. A static random access memory, comprising:
a memory cell array including a plurality of memory cells arranged into a plurality of memory cell columns, said memory cell column being divided into a plurality of memory cell groups each including a predetermined number of memory cells;
a plurality of bit lines provided in correspondence to said plurality of memory cell columns;
first decoding means supplied with column address data for selecting one of said plurality of memory cell columns;
second decoding means supplied with row address data for selecting one of said memory cell groups included in said selected memory cell column;
third decoding means supplied with said row address data for selecting one of said memory cells included in said selected memory cell group;
each memory cell group comprising said predetermined number of memory cells, a sub-bit line extending over said predetermined number of memory cells, a first selection circuit connected to said sub-bit line and further connected to one of said bit lines that corresponds to said memory cell group, said first selection circuit being activated in response to a first output signal of said second decoding means for causing a voltage change in said bit line in response to a voltage level on said sub-bit line, said first selection circuit comprising bulk transistors having diffusion regions formed in a semiconductor substrate, and a second selection circuit connected between said sub-bit line and said bit line that corresponds to said memory cell group, said second selection circuit comprising a transistor that is turned on in response to a second output signal of said second decoding means, for connecting said bit line and said sub-bit line electrically;
each memory cell comprising a plurality of thin film transistors connected with each other to form a flip-flop circuit, and a transfer gate transistor also of a thin film transistor for connecting said flip-flop circuit to said sub-bit line of the memory cell group in which said memory cell is included, said transfer gate being turned on in response to an output of said third decoding means;
said thin film transistors forming said second selection circuit being constructed on an elongate polysilicon strip such that said thin film transistor has a channel region formed in said polysilicon strip, with doped regions acting as source and drain of carriers formed at both sides of said channel region.

2. A static random access memory as claimed in claim 1 in which said bulk transistors forming said first selection circuit include a first bulk MOS transistor and a second bulk MOS transistor connected in series with each other between said bit line and a ground, said first bulk MOS transistor being turned on in response to said first output signal of said second decoding means and said second bulk MOS transistor being turned on in response to a voltage level on said sub-bit line.

3. A static random access memory as claimed in claim 1 in which said memory cell group includes said memory cells with a number that is smaller than 16.

4. A static random access memory as claimed in claim 1 in which said thin film transistors are arranged into a plurality of levels above said semiconductor substrate in which said bulk transistors forming said first selection circuit are formed.

5. A static random access memory as claimed in claim 1 in which said second decoding means is supplied with a read/write control signal and produces said first output signal when reading data and said second decoding means produces said second output signal when writing data.

6. A static random access memory as claimed in claim 1 in which each of said bit lines includes a first bit line and a second bit line for carrying complementary electric signals, each of said sub-bit lines including a first sub-bit line and a second sub-bit line for carrying complementary electric signals, wherein said first and second selection circuits are provided between said first bit line and said first sub-bit line and between said second bit line and said second sub-bit line.

7. A static random access memory as claimed in claim 1 in which said memory cell includes a first p-channel thin film transistor and a first n-channel thin film transistor connected in series between a first voltage source and a second voltage source to form a first CMOS inverter, and a second p-channel thin film transistor and a second n-channel thin film transistor connected in series between the first voltage source and the second voltage source to form a second CMOS inverter, said first CMOS inverter and said second CMOS inverter being cross-coupled with each other to form said flip-flop circuit that forms the memory cell, wherein said first p-channel thin film transistor is provided above said first n-channel thin film transistor, and said second p-channel thin film transistor is provided above said second n-channel thin film transistor.

8. A method for reading data from a static random access memory that includes memory cells, each memory cell comprising a flip-flop circuit of thin film transistors, comprising the steps of:
- selecting a bit line that corresponds to a memory cell column that includes therein a selected memory cell;
- selecting a memory cell group that is included in said selected memory cell column and that includes therein said selected memory cell, said memory cell group including a sub-bit line that extends commonly for the memory cells included in said memory cell group;
- selecting a memory cell that is included in said selected memory cell group;
- detecting a voltage level of the sub-bit line of the selected memory cell group when reading data; and
- discharging the selected bit line in response to the result of the detection by a bulk transistor that has a diffusion region formed in a semiconductor substrate; and
- connecting the selected bit line to the sub-bit line of the selected memory cell group via a thin film transistor.

9. A static random access memory, comprising:
- a memory cell array including a plurality of memory cells arranged into a plurality of memory cell columns each including a plurality of memory cells, said memory cells in each memory cell column being divided into a plurality of memory cell groups each including a predetermined number of memory cells;
- a plurality of complementary bit lines provided in correspondence to said plurality of memory cell columns, each complementary bit line comprising a first bit line and a second bit line for carrying complementary electric signals;
- first decoding means supplied with column address data for selecting one of said plurality of memory cell columns;
- second decoding means supplied with row address data for selecting one of said memory cell groups included in said selected memory cell column;
- third decoding means supplied with an output of said second decoding means and further with said row address data for selecting one of said memory cells included in said selected memory cell group, said third decoding means producing a first output signal indicating a selected memory cell group when reading data, said third decoding means producing further a second output signal indicating a selected memory cell group when writing data;
- each memory cell group comprising a complementary sub-bit line, said complementary sub-bit line comprising a first sub-bit line and a second sub-bit line for carrying complementary electric signals, first and second bulk transistors connected in series with each other across said first bit line and a ground for causing electric charges on said first bit line to flow to the ground when said first and second bulk transistors are turned on, said first bulk transistor being turned on in response to said first output signal of said third decoding means, said second bulk transistor being connected to said first sub-bit line so as to be turned on in response to an electric signal on said first sub-bit line, third and fourth bulk transistors connected in series with each other across said second bit line and the ground for causing electric charges on said second bit line to flow to the ground when said third and fourth bulk transistors are turned on, said third bulk transistor being turned on in response to said first output signal of said third decoding means, said fourth bulk transistor being connected to said second sub-bit line so as to be turned on in response to an electric signal on said second sub-bit line, a first selection thin film transistor provided across said first bit line and said first sub-bit line for connecting said first bit line and said first sub-bit line electrically when turned on, said first selection thin film transistor being turned on in response to said second output signal of said third decoding means, a second selection thin film transistor provided across said second bit line and said second sub-bit line for connecting said second bit line and said second sub-bit line electrically when turned on, said second selection thin film transistor being turned on in response to said third output signal of said third decoding means;
- each memory cell comprising a first p-channel thin film transistor and a first n-channel thin film transistor connected in series across a first voltage source and a second voltage source to form a first CMOS inverter, and a second p-channel thin film transistor and a second n-channel thin film transistor connected in series across said first voltage source and said second voltage source to form a second CMOS inverter, said first p-channel thin film transistor and said first n-channel thin film transistor having respective gates commonly connected to a node where said second p-channel thin film transistor and said second n-channel thin film transistor are connected with each other, said second p-channel thin film transistor and said second n-channel thin film transistor having respective gates commonly connected to a node where said first p-channel thin film transistor and said first n-channel thin film transistor are connected with each other, said first and second p-channel MOS transistors and said first and second n-channel MOS transistors forming a flip-flop circuit, each memory cell further comprising a first transfer gate thin film transistor provided across said node where said first p-channel thin film transistor and said first n-channel thin film transistor are connected with each other and said first sub-bit line that corresponds to the memory cell group that in turn includes therein said memory cell, for connecting the same electrically when turned on, said first transfer gate thin film transistor being turned on in response to an output signal of said third decoding means, and a second transfer gate thin film transistor provided across said node where said second p-channel thin film transistor and said second n-channel thin film transistor are connected with each other and said second sub-bit line that corresponds to the memory cell group that in turn includes therein said memory cell, for connecting the same with each other electrically when turned on, said second transfer gate thin film transistor being turned on in response to an output signal of said third decoding means;

each of said p-channel thin film transistor, said n-channel thin film transistor, and said selection thin film transistor having an elongate polysilicon strip provided above a semiconductor substrate, said elongate polysilicon strip being formed with an undoped region in correspondence to a channel region of a MOS transistor, and a pair of diffusion regions provided at both sides of said channel region when viewed in an elongate direction of said polysilicon strip, said p-channel thin film transistor having said diffusion regions doped to the p-type, said n-channel thin film transistor having said diffusion regions doped to the n-type;

each of said first through fourth bulk transistors having diffusion regions formed in a substrate.

* * * * *